US008341332B2

(12) United States Patent
Ma et al.

(10) Patent No.: US 8,341,332 B2
(45) Date of Patent: *Dec. 25, 2012

(54) MULTI-LEVEL CONTROLLER WITH SMART STORAGE TRANSFER MANAGER FOR INTERLEAVING MULTIPLE SINGLE-CHIP FLASH MEMORY DEVICES

(75) Inventors: Abraham C. Ma, Fremont, CA (US); David Q. Chow, San Jose, CA (US); Charles C. Lee, Cupertino, CA (US); Frank Yu, Palo Alto, CA (US)

(73) Assignee: Super Talent Electronics, Inc., San Jose, CA (US)

( * ) Notice: Subject to any disclaimer, the term of this patent is extended or adjusted under 35 U.S.C. 154(b) by 870 days.

This patent is subject to a terminal disclaimer.

(21) Appl. No.: 12/186,471

(22) Filed: Aug. 5, 2008

(65) Prior Publication Data

US 2008/0320214 A1     Dec. 25, 2008

Related U.S. Application Data

(63) Continuation-in-part of application No. 12/054,310, filed on Mar. 24, 2008, now Pat. No. 7,877,542, and a continuation-in-part of application No. 10/707,277, filed on Dec. 2, 2003, now Pat. No. 7,103,684, and a continuation-in-part of application No. 12/035,398, filed on Feb. 21, 2008, now Pat. No. 7,953,931, and a continuation-in-part of application No. 11/770,642, filed on Jun. 28, 2007, now Pat. No. 7,889,544, and a continuation-in-part of application No. 11/748,595, filed on May 15, 2007, now Pat. No. 7,471,556, and a continuation-in-part of application No. 11/871,011, filed on Oct. 11, 2007, now Pat. No. 7,934,074, and a continuation-in-part of application No. 11/458,987, filed on Jul. 20, 2006, now Pat. No. 7,690,030, and a continuation-in-part of application No. 10/818,653, filed on Apr. 4, 2005, now Pat. No. 7,243,185, and a continuation-in-part of application No. 12/128,916, filed on May 29, 2008, now Pat. No. 7,552,251, and a continuation-in-part of application No. 10/761,853, filed on Jan. 20, 2004, now abandoned, and a continuation-in-part of application No. 11/871,627, filed on Oct. 12, 2007, now Pat. No. 7,966,462, and a continuation-in-part of application No. 11/309,594, filed on Aug. 28, 2006, now Pat. No. 7,383,362.

(51) Int. Cl.
| G06F 12/00 | (2006.01) |
| G06F 13/00 | (2006.01) |
| G06F 13/28 | (2006.01) |

(52) U.S. Cl. ...................................................... 711/103
(58) Field of Classification Search ................... 711/103
See application file for complete search history.

(56) References Cited

U.S. PATENT DOCUMENTS 5,680,579 A * 10/1997 Young et al. .................. 711/157
(Continued)

FOREIGN PATENT DOCUMENTS
WO     WO01/61703 A2     8/2001

*Primary Examiner* — Sheng-Jen Tsai
(74) *Attorney, Agent, or Firm* — Stuart T. Auvinen; gPatent LLC

(57) ABSTRACT

A solid-state disk (SSD) has a smart storage switch with a smart storage transaction manager that re-orders host commands for accessing downstream single-chip flash-memory devices. Each single-chip flash-memory device has a lower-level controller that converts logical block addresses (LBA) to physical block addresses (PBA) that access flash memory blocks in the single-chip flash-memory device. Wear-leveling and bad block remapping are preformed by each single-chip flash-memory device, and at a higher level by a virtual storage processor in the smart storage switch. Virtual storage bridges between the smart storage transaction manager and the single-chip flash-memory devices bridge LBA transactions over LBA buses to the single-chip flash-memory devices. Data striping and interleaving among multiple channels of the single-chip flash-memory device is controlled at a high level by the smart storage transaction manager, while further interleaving and remapping may be performed within each single-chip flash-memory device.

21 Claims, 32 Drawing Sheets

U.S. PATENT DOCUMENTS

| | | | |
|---|---|---|---|
| 5,905,993 A | 5/1999 | Shinohara | |
| 6,000,006 A * | 12/1999 | Bruce et al. | 711/103 |
| 6,112,265 A * | 8/2000 | Harriman et al. | 710/40 |
| 6,721,843 B1 | 4/2004 | Estakhri | |
| 6,772,274 B1 | 8/2004 | Estakhri | |
| 6,845,438 B1 * | 1/2005 | Tanaka et al. | 711/206 |
| 7,073,010 B2 | 7/2006 | Chen et al. | |
| 7,155,559 B1 * | 12/2006 | Estakhri et al. | 711/103 |
| 7,194,596 B2 | 3/2007 | Wu et al. | |
| 7,263,591 B2 | 8/2007 | Estakhri et al. | |
| 7,397,713 B2 * | 7/2008 | Harari et al. | 365/200 |
| 2004/0186946 A1 * | 9/2004 | Lee | 711/103 |
| 2006/0136687 A1 | 6/2006 | Conley et al. | |
| 2007/0083697 A1 | 4/2007 | Birrell et al. | |
| 2007/0091697 A1 | 4/2007 | Salessi et al. | |
| 2007/0268754 A1 | 11/2007 | Lee et al. | |
| 2008/0028131 A1 | 1/2008 | Kudo et al. | |
| 2008/0028165 A1 | 1/2008 | Sukegawa | |
| 2008/0098164 A1 * | 4/2008 | Lee et al. | 711/103 |
| 2008/0155160 A1 | 6/2008 | McDaniel | |
| 2008/0155177 A1 | 6/2008 | Sinclair et al. | |
| 2008/0155182 A1 | 6/2008 | Kudo | |
| 2008/0162792 A1 | 7/2008 | Wu et al. | |
| 2008/0162793 A1 | 7/2008 | Chu et al. | |
| 2008/0320214 A1 * | 12/2008 | Ma et al. | 711/103 |
| 2009/0074408 A1 * | 3/2009 | Black et al. | 398/45 |
| 2009/0193184 A1 * | 7/2009 | Yu et al. | 711/103 |
| 2009/0204872 A1 * | 8/2009 | Yu et al. | 714/773 |

* cited by examiner

HUB MODE

SWITCH MODE

SDRAM BUFFERING & CMD RE-ORDERING

SDRAM BUFFERING & CMD RE-ORDERING

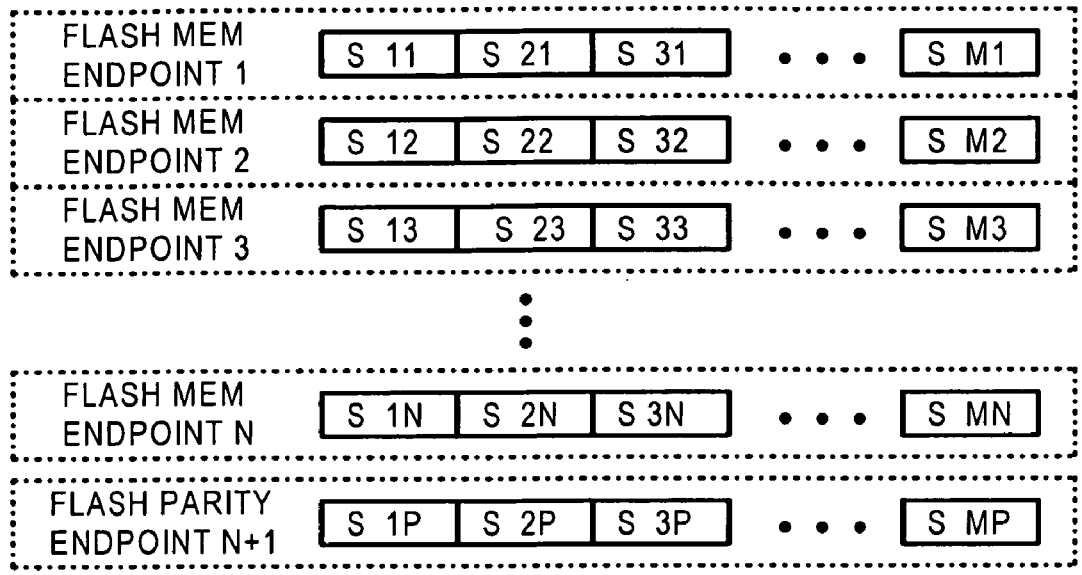
ONE DIMENSIONAL    FIG. 14C
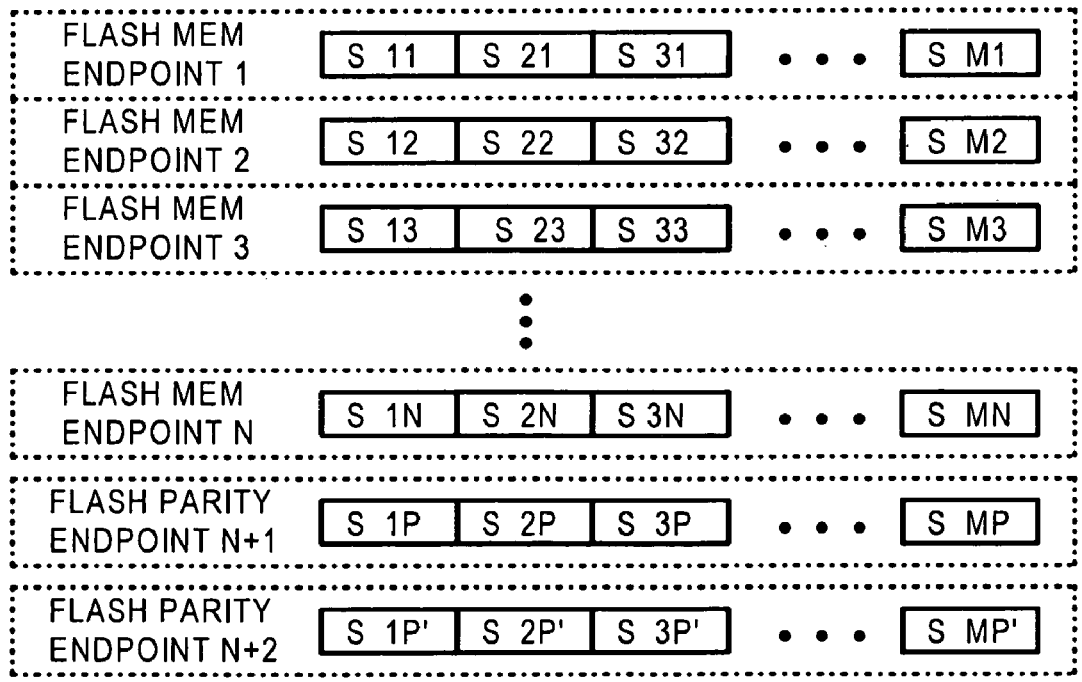
TWO DIMENSIONAL    FIG. 14D

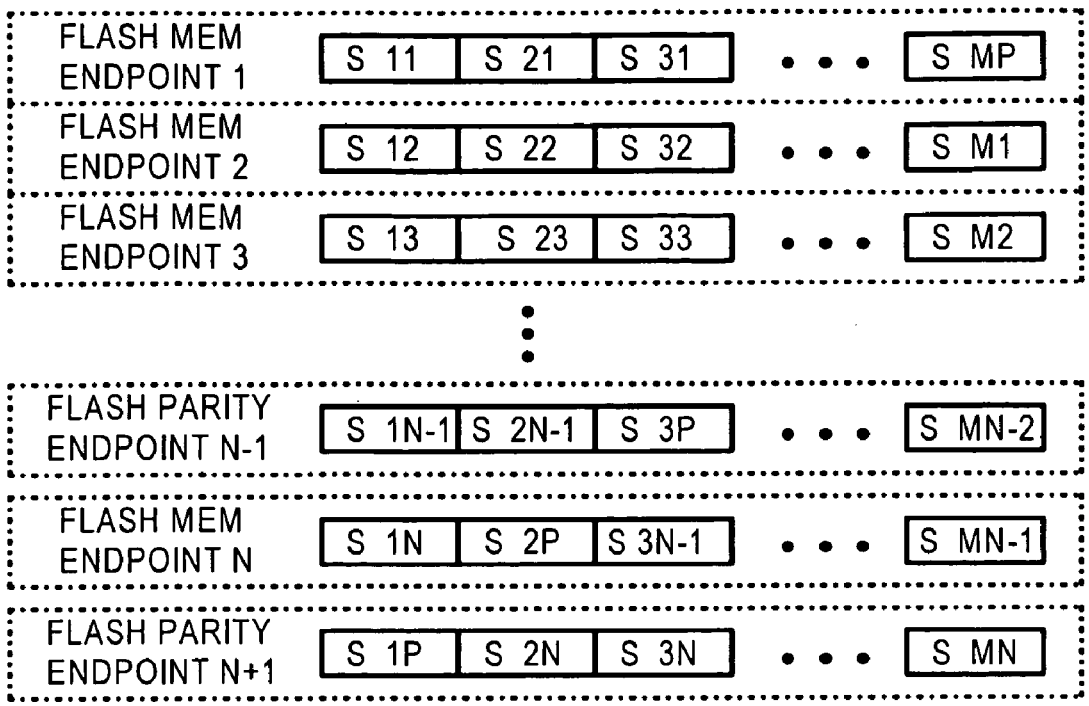
DISTRIBUTED PARITY    FIG. 14E
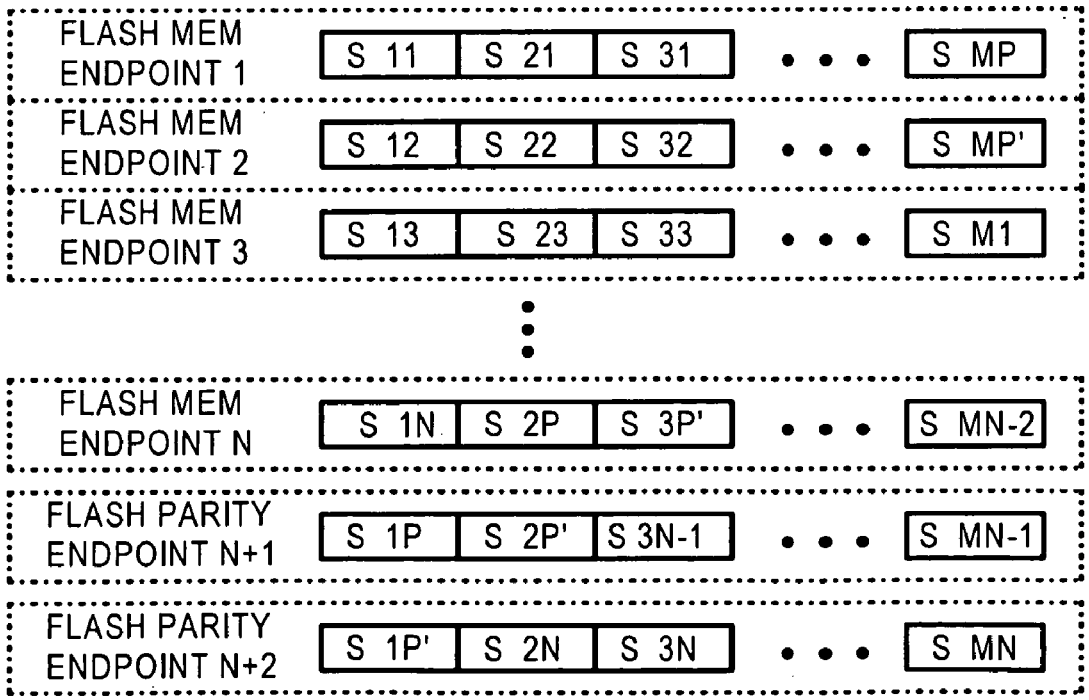
FIG. 14F
DISTRIBUTED PARITY

MULTI-LEVEL CONTROLLER WITH SMART STORAGE TRANSFER MANAGER FOR INTERLEAVING MULTIPLE SINGLE-CHIP FLASH MEMORY DEVICES

RELATED APPLICATIONS

This application is a continuation-in-part (CIP) of "High Integration of Intelligent Non-Volatile Memory Devices", Ser. No. 12/054,310, filed Mar. 24, 2008, which is a CIP of "High Endurance Non-Volatile Memory Devices", Ser. No. 12/035,398, filed Feb. 21, 2008, which is a CIP of "High Speed Controller for Phase Change Memory Peripheral Devices", U.S. application Ser. No. 11/770,642, filed on Jun. 28, 2007, which is a CIP of "Local Bank Write Buffers for Acceleration a Phase Change Memory", U.S. application Ser. No. 11/748,595, filed May 15, 2007, which is CIP of "Flash Memory System with a High Speed Flash Controller", application Ser. No. 10/818,653, filed Apr. 5, 2004, now U.S. Pat. No. 7,243,185.

This application is also a CIP of co-pending U.S. Patent Application for "Multi-Channel Flash Module with Plane-Interleaved Sequential ECC Writes and Background Recycling to Restricted-write Flash Chips", Ser. No. 11/871,627, filed Oct. 12, 2007, and is also a CIP of "Flash Module with Plane-Interleaved Sequential Writes to Restricted-Write Flash Chips", Ser. No. 11/871,011, filed Oct. 11, 2007.

This application is a continuation-in-part (CIP) of co-pending U.S. Patent Application for "Single-Chip Multi-Media Card/Secure Digital controller Reading Power-on Boot Code from Integrated Flash Memory for User Storage", Ser. No. 12/128,916, filed on May 29, 2008, which is a continuation of U.S. Patent Application for "Single-Chip Multi-Media Card/Secure Digital controller Reading Power-on Boot Code from Integrated Flash Memory for User Storage", Ser. No. 11/309,594, filed on Aug. 28, 2006, now issued as U.S. Pat. No. 7,383,362, which is a CIP of U.S. Patent Application for "Single-Chip USB Controller Reading Power-On Boot Code from Integrated Flash Memory for User Storage", Ser. No. 10/707,277, filed on Dec. 2, 2003, now issued as U.S. Pat. No. 7,103,684.

This application is also a CIP of co-pending U.S. Patent Application for "Electronic Data Flash Card with Fingerprint Verification Capability", Ser. No. 11/458,987, filed Jul. 20, 2006, which is a CIP of U.S. Patent Application for "Highly Integrated Mass Storage Device with an Intelligent Flash Controller", Ser. No. 10/761,853, filed Jan. 20, 2004, now abandoned.

FIELD OF THE INVENTION

This invention relates to flash-memory solid-state-drive (SSD) devices, and more particularly to a smart storage switch connecting to multiple single-chip flash-memory-device endpoints.

BACKGROUND OF THE INVENTION

Personal computers (PC's) and other hosts store large amounts of data in mass-storage devices such as hard disk drives (HDD). Mass-storage devices are block-addressable rather than byte-addressable, since the smallest unit that can be read or written is a page that is several 512-byte sectors in size. Flash memory is replacing hard disks and optical disks as the preferred mass-storage medium.

NAND flash memory is a type of flash memory constructed from electrically-erasable programmable read-only memory (EEPROM) cells, which have floating gate transistors. These cells use quantum-mechanical tunnel injection for writing and tunnel release for erasing. NAND flash is non-volatile so it is ideal for portable devices storing data. NAND flash tends to be denser and less expensive than NOR flash memory.

However, NAND flash has limitations. In the flash memory cells, the data is stored in binary terms—as ones (1) and zeros (0). One limitation of NAND flash is that when storing data (writing to flash), the flash can only write from ones (1) to zeros (0). When writing from zeros (0) to ones (1), the flash needs to be erased a "block" at a time. Although the smallest unit for read or program can be a byte or a word, the smallest unit for erase is a block.

Single Level Cell (SLC) flash and Multi Level Cell (MLC) flash are two types of NAND flash. The erase block size of SLC flash may be 128K+4K bytes while the erase block size of MLC flash may be 256K+8K bytes. Another limitation is that NAND flash memory has a finite number of erase cycles between 10,000 to 1,000,000, after which the flash wear out and becomes unreliable.

Comparing MLC flash with SLC flash, MLC flash memory has advantages and disadvantages in consumer applications. In the cell technology, SLC flash stores a single bit of data per cell, whereas MLC flash stores two or more bits of data per cell. MLC flash can have twice or more the density of SLC flash with the same technology. But the performance, reliability and durability may decrease for MLC flash.

A consumer may desire a large capacity flash-memory system, perhaps as a replacement for a hard disk. A solid-state disk (SSD) made from flash-memory chips has no moving parts and is thus more reliable than a rotating disk.

Several smaller flash drives could be connected together, such as by plugging many flash drives into a USB hub that is connected to one USB port on a host, but then these flash drives appear as separate drives to the host. For example, the host's operating system may assign each flash drive its own drive letter (D:, E:, F:, etc.) rather than aggregate them together as one logical drive, with one drive letter. A similar problem could occur with other bus protocols, such as Serial AT-Attachment (SATA), integrated device electronics (IDE), and Peripheral Components Interconnect Express (PCIe). The parent application, now U.S. Pat. No. 7,103,684, describes a single-chip controller that connects to several flash-memory mass-storage blocks.

Larger flash systems may use several channels to allow parallel access, improving performance. A wear-leveling algorithm allows the memory controller to remap logical addresses to different physical addresses so that data writes can be evenly distributed. Thus the wear-leveling algorithm extends the endurance of the MLC flash memory.

What is desired is a multi-channel flash system with single-chip flash-memory devices in each of the channels. A smart storage switch or hub is desired between the host and the multiple single-chip flash-memory devices so that the multiple channels of flash are aggregated together into a single logical drive. It is further desired that the smart storage switch interleaves and stripes data accesses to the multiple channels of single-chip flash-memory devices, and that each of the single-chip flash-memory devices may further perform internal interleaving, wear-leveling, and address remapping.

BRIEF DESCRIPTION OF THE DRAWINGS

FIGS. 14A-F show various arrangements of data stored in the flash storage blocks.

DETAILED DESCRIPTION

The present invention relates to an improvement in solid-state flash drives. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
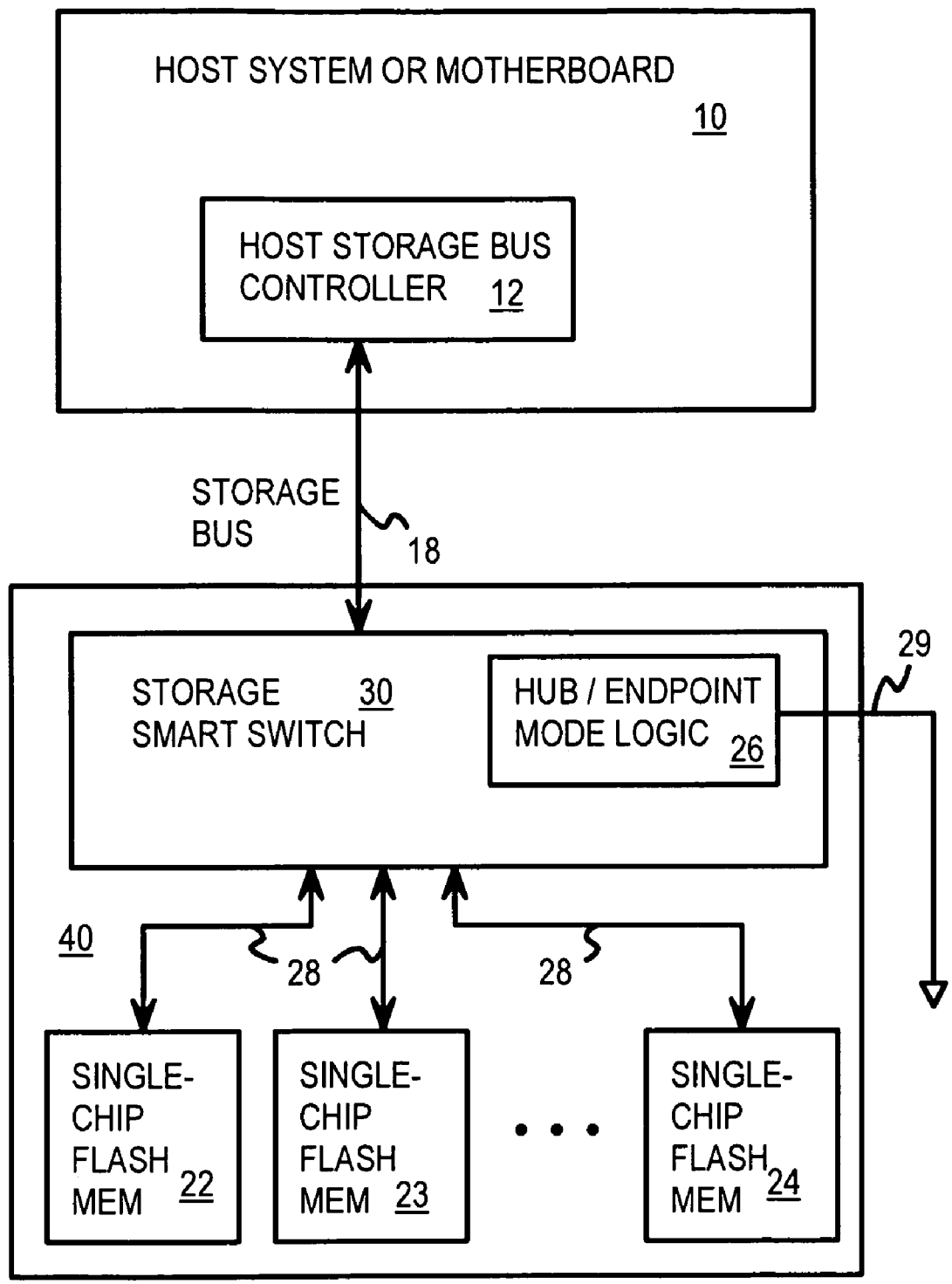
FIG. 1 is a block diagram of a switch that aggregates and virtualizes multiple flash-memory endpoints.

FIG. 1 is a block diagram of a switch that aggregates and virtualizes multiple flash-memory endpoints. Host controller 12 for host 10 sends transactions over storage bus 18 to multi-flash device 40. Smart storage switch 30 on multi-flash device 40 receives and responds to transaction from host 10 over storage bus 18.

Mode logic 26 causes smart storage switch 30 to operate in one of two modes. When mode pin 29 is grounded, mode logic 26 causes smart storage switch 30 to operate in a single-endpoint mode, wherein smart storage switch 30 aggregates all downstream storage flash-memory systems into a single storage endpoint that is visible host 10. The details about the number, size, speed, and arrangement of the physical flash-memory devices are hidden from host controller 12 by smart storage switch 30 when operating in single-endpoint mode. Host 10 sees a single pool of memory having one set of attributes. Attributes reported to host 10 can be chosen by a transaction manager in smart storage switch 30, such as the slowest access time, or the sum of all the good blocks of memory.

When operating in single-endpoint mode, smart storage switch 30 acts as the final storage endpoint for transactions on storage bus 18 to host 10. Smart storage switch 30 generates storage transactions on hidden storage buses 28 to flash storage blocks 22, 23, 24. Flash storage blocks 22, 23, 24 respond to smart storage switch 30 over hidden storage buses 28 with smart storage switch 30 acting as the host on hidden storage buses 28. Smart storage switch 30 then forwards data to host 10 by acting as the endpoint. Thus flash storage blocks 22, 23, 24 are hidden from host 10 when mode logic 26 activates the single-endpoint mode. Each flash-storage block 22, 23, 24 has a flash memory controller which is able to perform wear-leveling, bad block replacement, parity and/or ECC operation.

Flash storage blocks 22, 23, 24 are aggregated together by smart storage switch 30, which maps and directs data transactions to selected flash storage blocks 22, 23, 24. Since smart storage switch 30 performs memory management, flash storage blocks 22, 23, 24 appear as a single, contiguous memory to host 10. Since host 10 sees smart storage switch 30 as the only endpoint of storage bus 18, data read or written to flash storage blocks 22, 23, 24 are all on a single virtual drive, such as drive letter E: on a PC. The details and complexities of flash storage blocks 22, 23, 24 are hidden from the end user.

When mode pin 29 is not grounded, mode logic 26 causes smart storage switch 30 to operate in multi-endpoint or hub mode. In hub mode, smart storage switch 30 acts as a normal hub, passing transactions from host controller 12 on storage bus 18 over hidden storage buses 28 to flash storage blocks 22, 23, 24. Host 10 then sees flash storage blocks 22, 23, 24 as the final endpoints. Each of the multiple flash endpoints appears as a different drive letter, E:, F:, G:, etc.

Mode logic 26 may be hardware logic, or may be firmware that is re-programmable. Smart storage switch 30 may be an external solid-state disk (SSD) that is external to the PC motherboard, or may be plugged into a socket on the PC motherboard as an internal SSD, or may be embedded into or permanently attached to the PC motherboard.

FIGS. 2A-D show various application environments of flash-memory devices. The non-volatile memory devices (NVMD) and single-chip flash memory in these figures may be replaced with multi-flash device 40 of FIG. 1 or other embodiments shown later using smart storage switch 30 or smart storage smart storage transaction manager 36.

Figure 2A:
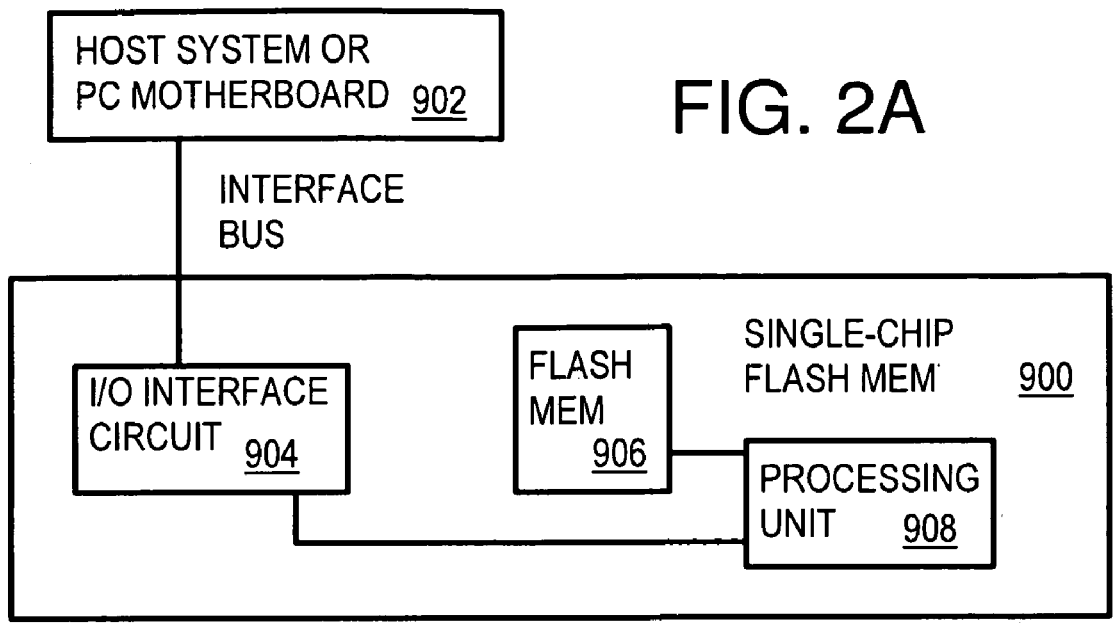
FIGS. 2A-D show various application environments of flash-memory devices.

FIG. 2A shows a single-chip flash-memory device on a host. Host system or PC motherboard 902 sends commands, addresses, and data over an interface bus to I/O interface circuit 904 on single-chip flash memory 900. These commands cause processing unit 908 to write, read, or erase blocks of flash memory 906. Single-chip flash memory 900 can be in a plastic card body with a connector that fits into a slot on the host, or can be directly mounted onto the host motherboard.

Single-chip flash-memory 900 can be an external flash memory module that is plugged into a socket on the PC motherboard, or can be directly or indirectly attached to or embedded on the PC motherboard.

Figure 2B:
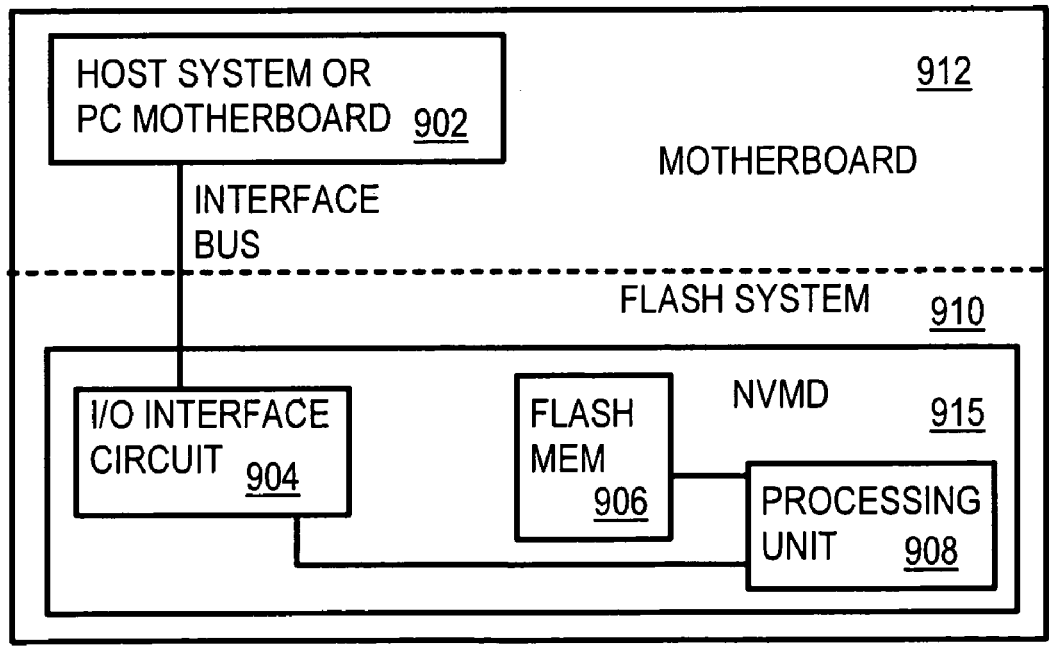

FIG. 2B shows an electronic data flash system integrated onto the PC motherboard. Host system or PC motherboard 902 sends commands, addresses, and data over an interface bus to I/O interface circuit 904 on flash system 910, which is a portion of motherboard 902. These commands cause processing unit 908 to write, read, or erase blocks of flash memory 906. Flash system 910 does not need a connector or a casing since it is integrated directly on the PC motherboard. Non-Volatile Memory Device (NVMD) 915 contains I/O interface circuit 904, processing unit 908, and flash memory 906.

Figure 2C:
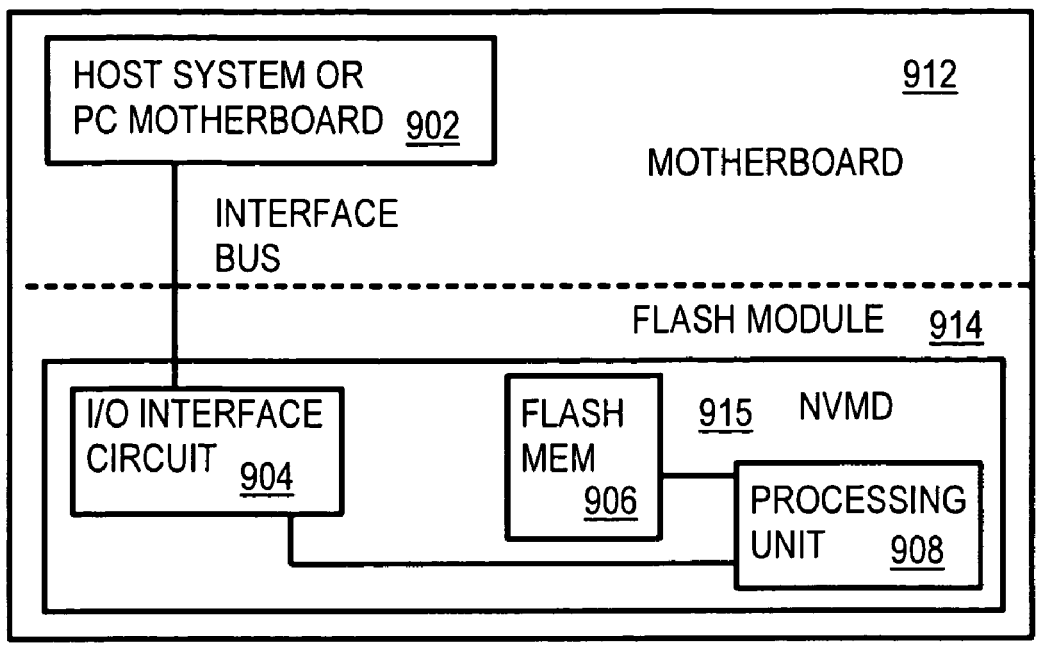

FIG. 2C shows an electronic data flash system in a flash module. Host system or PC motherboard 902 sends commands, addresses, and data over an interface bus to I/O interface circuit 904 on flash module 914. These commands cause processing unit 908 to write, read, or erase blocks of flash memory 906. Flash module 914 can be a printed-circuit-board-assembly (PCBA) that is mounted on PC motherboard 902, or a module similar to a memory module that fits into a socket on the PC motherboard. NVMD 915 contains I/O interface circuit 904, processing unit 908, and flash memory 906. Alternately, NVMD 915 can contain flash memory 906 only with connections communicating to PC motherboard 902, which includes IO interface circuit 904 and processing unit 908.

Figure 2D:
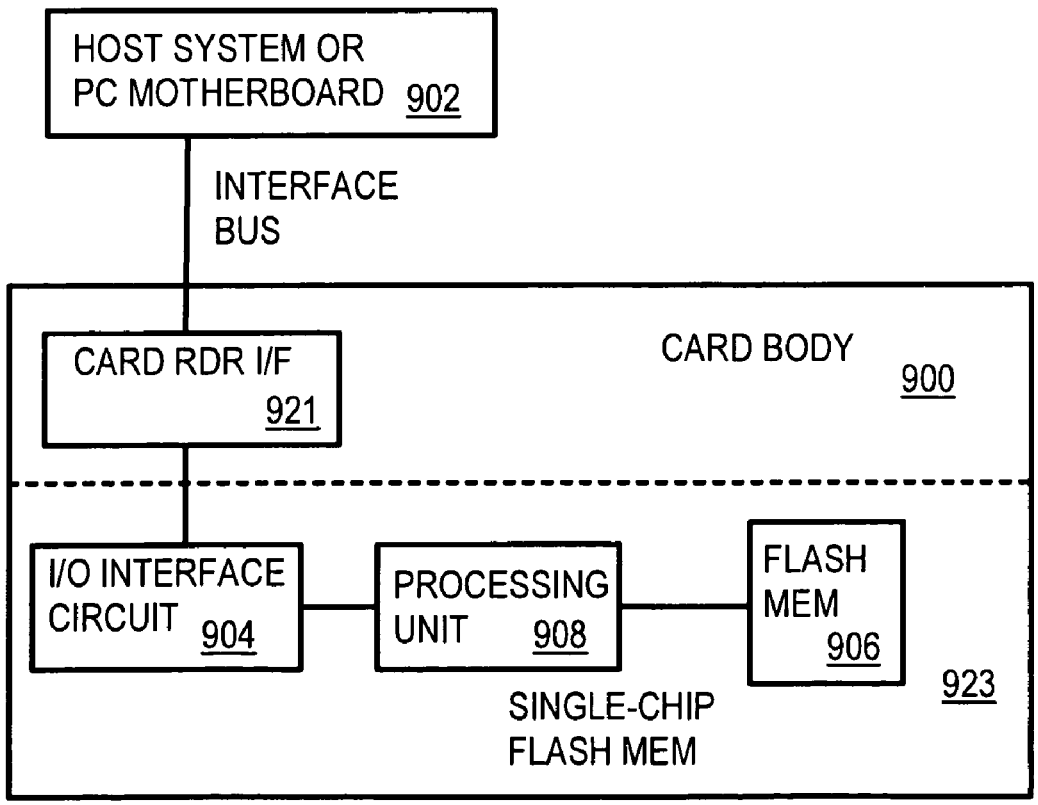

FIG. 2D shows an electronic data flash system in a flash-card reader. Host system or PC motherboard 902 sends commands, addresses, and data over an interface bus to card reader interface 921 on card body 900. Card reader interface 921 sends these to I/O interface circuit 904 on single-chip flash-memory device 923, which is plugged into the card reader. These commands cause processing unit 908 to write, read, or erase blocks of flash memory 906 on flash module 914.

Single-chip flash-memory device 923 can be a single chip or a single package with I/O interface circuit 904, processing unit 908, and flash memory 906. Single-chip flash-memory device 923 can be encased in a plastic card body with a connector that fits into a slot on the host.

Figure 3:
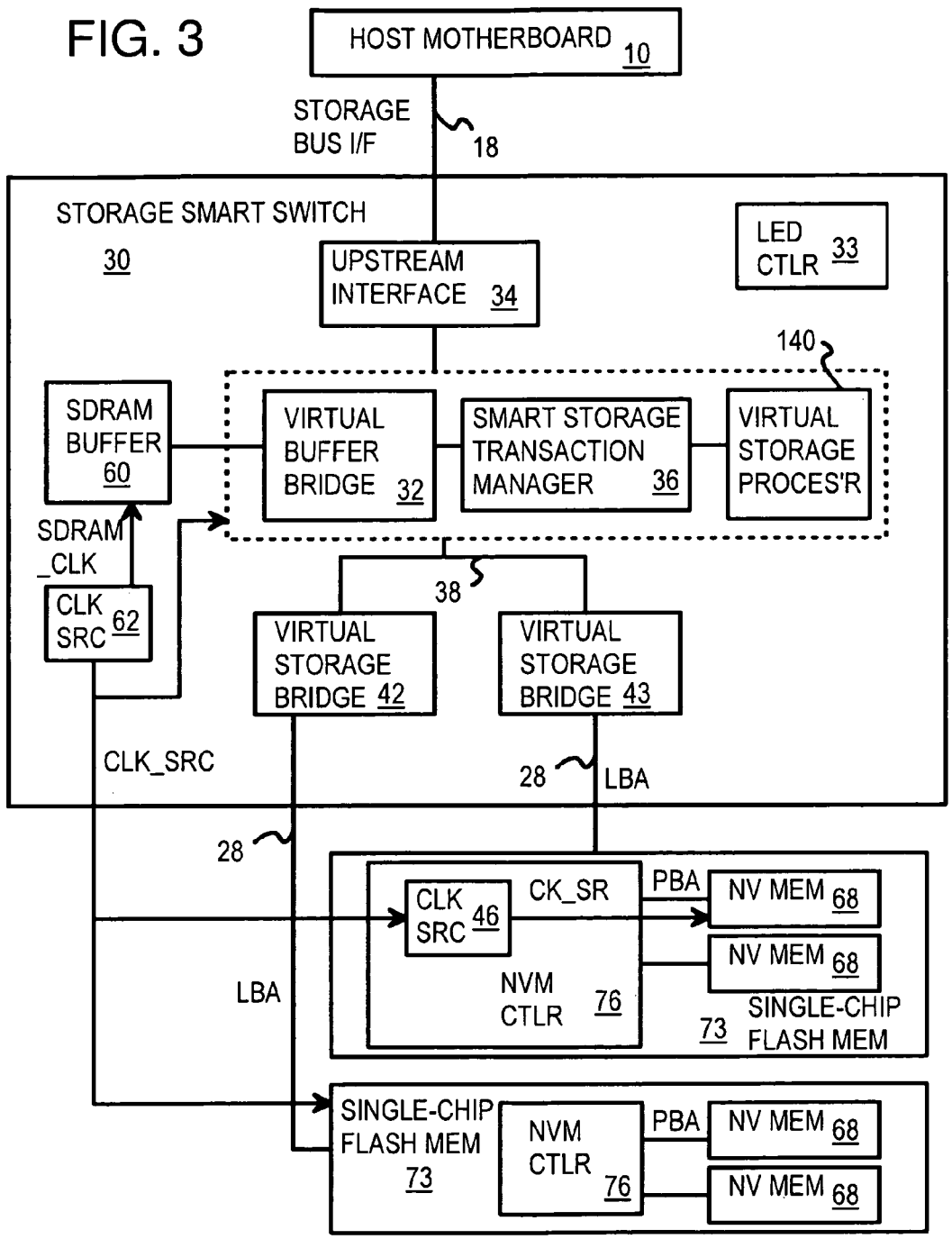
FIG. 3 shows the smart storage switch in more detail.

FIG. 3 shows the smart storage switch in more detail. Smart storage switch 30 connects to host storage bus 18 through upstream interface 34. Smart storage switch 30 also connects to downstream flash storage device over LBA buses 28 through virtual storage bridges 42, 43.

Virtual storage bridges 42, 43 are protocol bridges that also provide physical signaling, such as driving and receiving differential signals on any differential data lines of LBA buses 28, detecting or generating packet start or stop patterns, checking or generating checksums, and higher-level functions such as inserting or extracting device addresses and packet types and commands. The host address from host 12 contains a logical block address (LBA) that is sent over LBA buses 28, although this LBA may be remapped by smart storage switch 30 in some embodiments that perform two-levels of wear-leveling, bad-block management, etc.

Smart storage switch 30 may operate in single-endpoint mode at all times, so that mode logic 26 is not needed, or may be implemented in firmware. Smart storage switch 30 operates an aggregating and virtualizing switch.

Internal bus 38 allows data to flow among virtual buffer bridge 32 and bridges 42, 43. Buffers in SDRAM 60 coupled to virtual buffer bridge 32 can store the data. SDRAM 60 is a synchronous dynamic-random-access memory on smart storage switch 30. Alternately, SDRAM 60 buffer can be the storage space of a SDRAM memory module located in the host motherboard, since normally SDRAM module capacity on the motherboard is much larger and can save the cost of smart storage switch 30. Also, the functions of smart storage switch 30 can be embedded in the host motherboard to further increase system storage efficiency due to a more powerful CPU and larger capacity SDRAM space that is usually located in the host motherboard.

Virtual storage processor 140 provides re-mapping services to smart storage transaction manager 36. For example, logical addresses from the host can be looked up and translated into logical block addresses (LBA) that are sent over LBA buses 28 to single-chip flash-memory devices 73. Host data may be alternately assigned to single-chip flash-memory devices 73 in an interleaved fashion by virtual storage processor 140 or by smart storage transaction manager 36. NVM controller 76 in each of single-chip flash-memory devices 73 may then perform a lower-level interleaving among flash memory blocks 68 within each single-chip flash-memory device 73. Thus interleaving may be performed on two levels, both at a higher level by smart storage transaction manager 36 among two or more single-chip flash-memory devices 73, and within each single-chip flash-memory device 73 among flash memory blocks 68.

NVM controller 76 performs logical-to-physical remapping as part of flash translation layer function, which converts LBA's received on LBA buses 28 to PBA's that address actual non-volatile memory blocks in flash memory blocks 68. NVM controller 76 may perform wear-leveling and bad-block remapping and other management functions at a lower level. LED controller 33 controls illumination of a light-emitting diode (LED) for indicating the operating status of single-chip flash-memory devices 73 to a user.

When operating in single-endpoint mode, smart storage transaction manager 36 not only buffers data using virtual buffer bridge 32, but can also re-order packets for transactions from the host. A transaction may have several packets, such as an initial command packet to start a memory read, a data packet from the memory device back to the host, and a handshake packet to end the transaction. Rather than have all packets for a first transaction complete before the next transaction begins, packets for the next transaction can be re-ordered by smart storage switch 30 and sent to single-chip flash-memory devices 73 before completion of the first transaction. This allows more time for memory access to occur for the next transaction. Transactions are thus overlapped by re-ordering packets.

Packets sent over LBA buses 28 are re-ordered relative to the packet order on host storage bus 18. Transaction manager 36 may overlap and interleave transactions to different flash storage blocks, allowing for improved data throughput. For example, packets for several incoming host transactions are stored in SDRAM buffer 60 by virtual buffer bridge 32 or an associated buffer (not shown). Transaction manager 36 examines these buffered transactions and packets and re-orders the packets before sending them over internal bus 38 to a downstream flash storage block in one of single-chip flash-memory devices 73.

A packet to begin a memory read of a flash block through bridge 43 may be re-ordered ahead of a packet ending a read of another flash block through bridge 42 to allow access to begin earlier for the second flash block.

Clock source 62 may generate a clock to SDRAM 60 and to smart storage transaction manager 36 and virtual storage processor 140 and other logic in smart storage switch 30. A clock from clock source 62 may also be sent from smart storage switch 30 to single-chip flash-memory devices 73, which have an internal clock source 46 that generates an internal clock CK_SR that synchronizes transfers between NVM controller 76 and flash memory blocks 68 within single-chip flash-memory device 73. Thus the transfer of physical blocks and PBA are re-timed from the transfer of logical LBA's on LBA buses 28.

Figure 4:
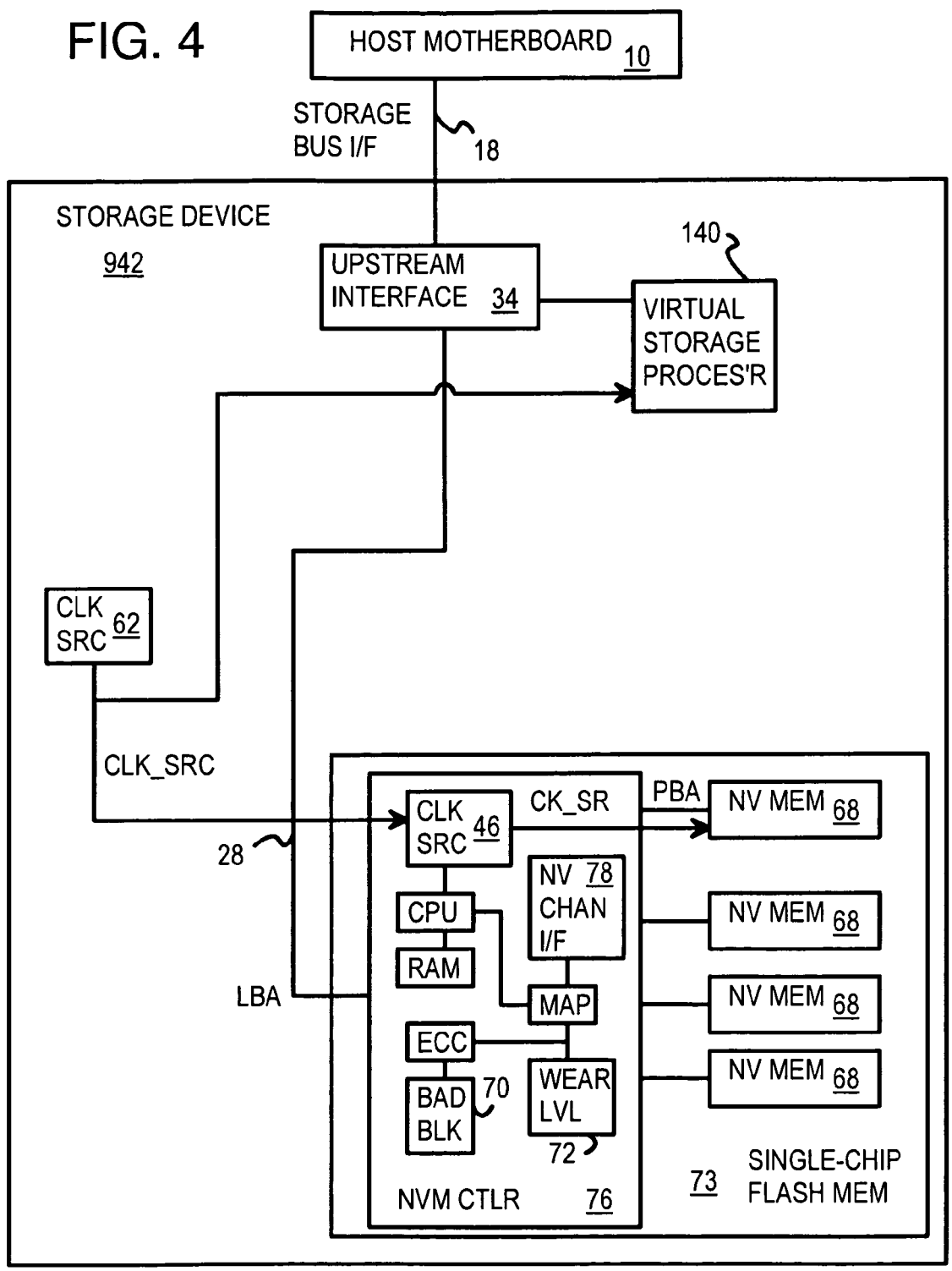
FIG. 4 is a diagram of a simplified smart storage device with only one single single-chip flash-memory device.

FIG. 4 is a diagram of a simplified smart storage device with only one single single-chip flash-memory device. Host 10 sends commands and logical addresses over host storage bus 18 to upstream interface 34 in storage device 942. Virtual storage processor 140 can remap host addresses to LBA bus 28. However, there is no smart storage transaction manager in this simplified embodiment. Instead, upstream interface 34 drives LBA bus 28 to single-chip flash-memory device 73. Clock source 62 clocks virtual storage processor 140 and clock source 46 inside NVM controller 76, which generates internal clock CK_SR to flash memory blocks 68.

Commands, data, and LBA's from LBA bus 28 are received by NVM controller 76 inside single-chip flash-memory device 73. Bad block manager 70 and wear-leveling unit 72 can re-map the LBA to a PBA to perform wear-leveling of flash memory blocks 68 and to avoid bad blocks in flash memory blocks 68. A CPU uses a map in NVM controller 76 to perform re-mapping to PBA's. Parity of other error-correction code (ECC) may be attached to incoming data and checked on data reads. The RAM can be volatile memory such as SRAM or SDRAM. NV channel interface 78 drives the PBA, data, and commands on PBA buses to flash memory blocks 68 from NVM controller 76.

Since NVM controller 76 inside single-chip flash-memory device 73 is able to perform remapping for wear-leveling and bad block replacement at a low level, a higher-level remapper is not necessary in storage device 942.

Figure 5:
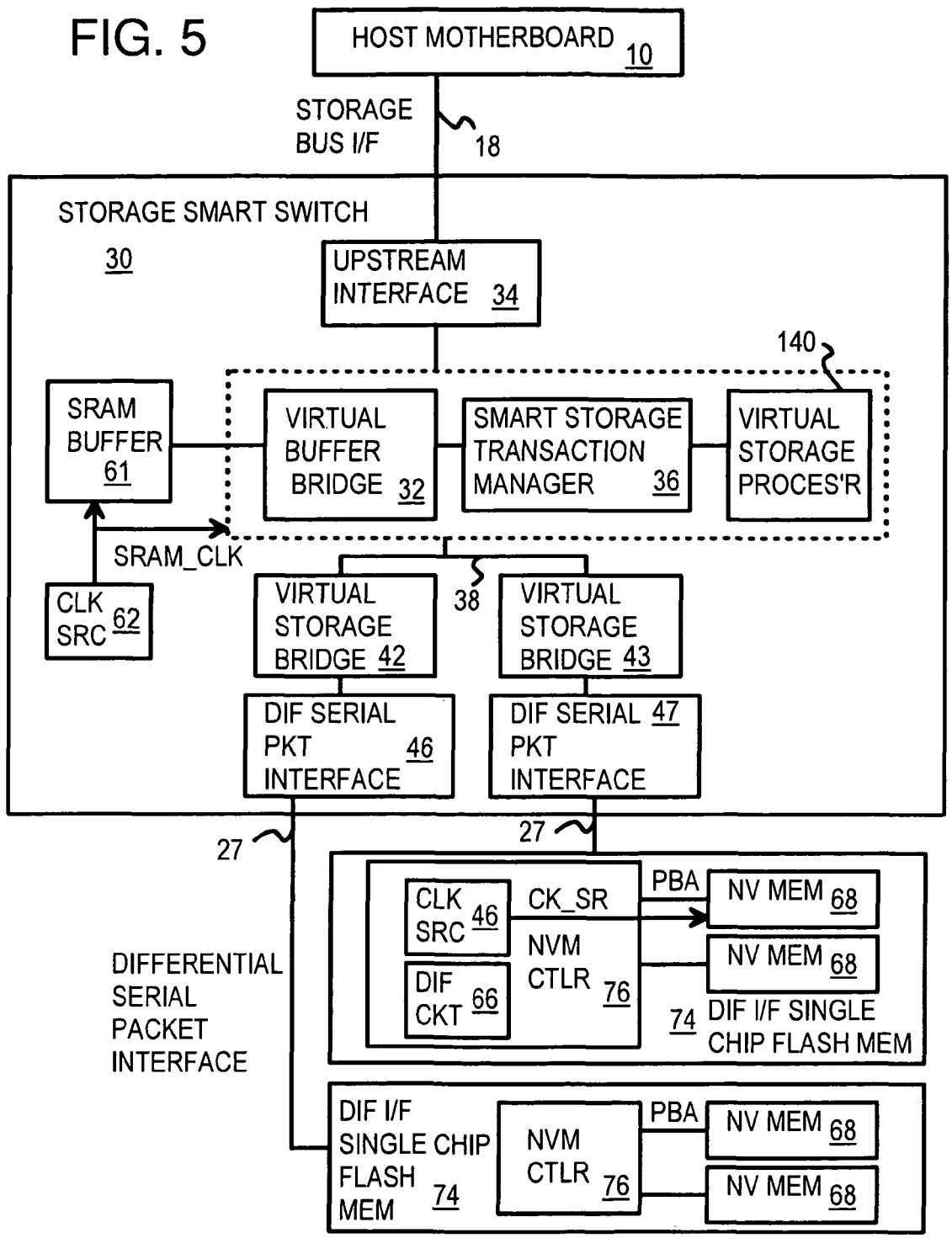
FIG. 5 shows a smart storage switch that uses a downstream storage bus interface to the single-chip flash-memory devices.

FIG. 5 shows a smart storage switch that uses a downstream storage bus interface to the single-chip flash-memory devices. Rather than use a LBA interface to single-chip flash-memory devices 73 over LBA buses 28, as shown in FIG. 3, a differential serial-packet interface is used on differential serial packet buses 27. Virtual storage bridges 42, 43 connect to storage downstream interfaces 46, 47 that drive differential serial packet buses 27, which are external to smart storage switch 30 rather than internal as in FIG. 3.

Differential serial packet interface circuit 66 is added to NVM controller 76 in each of differential serial packet interface single-chip flash-memory devices 74 to allow for interfacing to differential serial packet buses 27. Differential serial packet buses 27 use small-voltage-swing differential signals while LBA buses 28 use larger voltage parallel buses with more pins and higher power. Both buses use a LBA.

Clock source 46 inside NVM controller 76 does not need an external input from clock source 62 in smart storage switch 30, which only clocks internal components such as SRAM buffer 61. Differential serial packet buses 27 can be synchronous, with the clock embedded inside the transmit data. A clock source may extract clock information from the incoming data and provide clocking to the outgoing data. It also provides a clock to flash memory blocks 68 for synchronous interfaces. Differential serial packet buses 27 can be asynchronous, allowing NVM controller 76 and smart storage switch 30 to have different clocks. Having asynchronous clocks is especially beneficial due to possible noise on external differential serial packet buses 27 compared with internal LBA buses 28 (FIG. 3).

Figure 6:
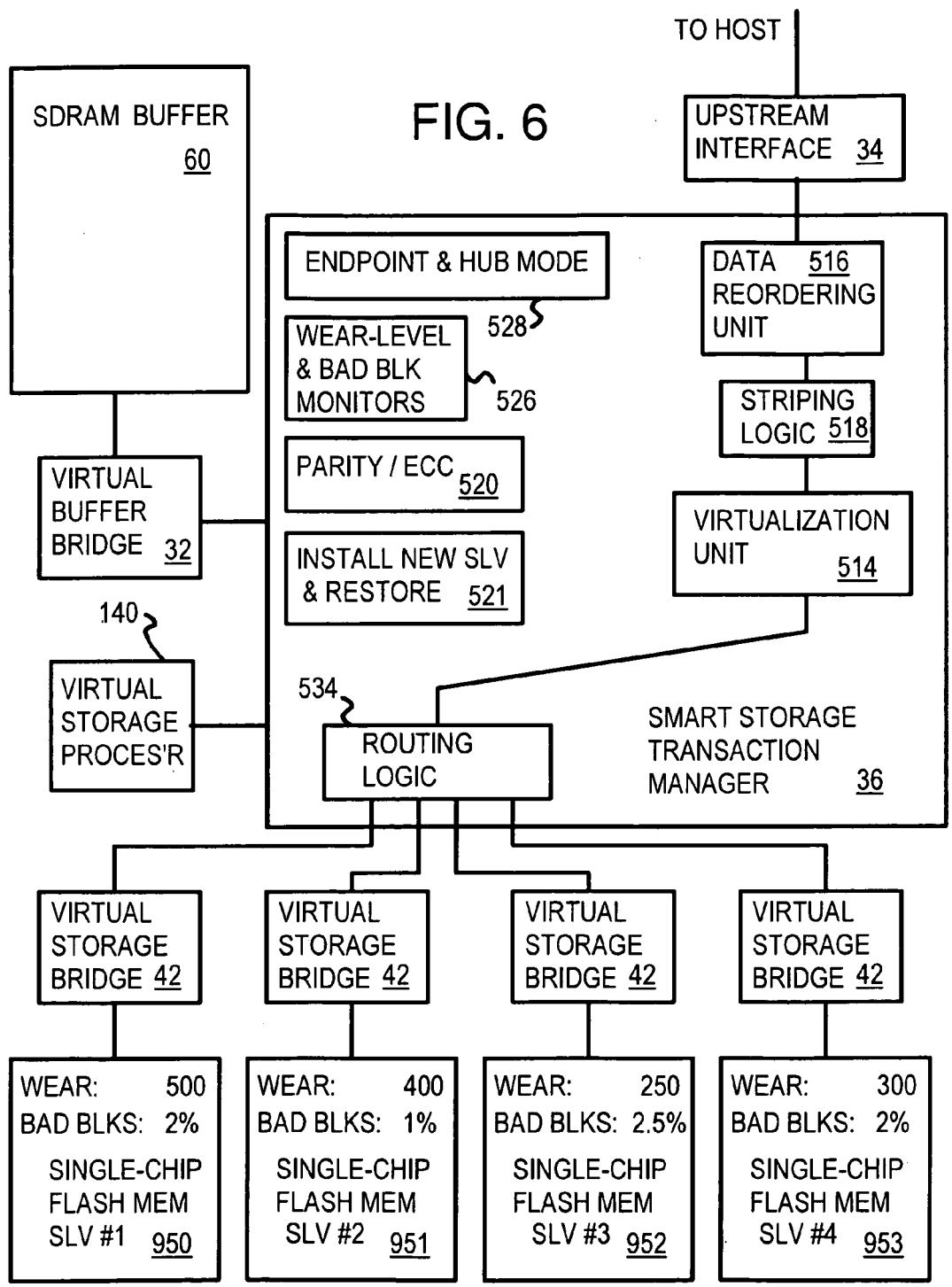
FIG. 6 shows a quad-channel smart storage switch with more details of the smart storage transaction manager.

FIG. 6 shows a quad-channel smart storage switch with more details of the smart storage transaction manager. Virtual storage processor 140, virtual buffer bridge 32 to SDRAM buffer 60, and upstream interface 34 to the host all connect to smart storage transaction manager 36 and operate as described earlier for FIG. 3.

Four channels to four single-chip flash-memory devices 950-953 are provided by four of virtual storage bridges 42 that connect to multi-channel interleave routing logic 534 in smart storage transaction manager 36. Host data can be interleaved among the four channels and four single-chip flash-memory devices 950-953 by routing logic 534 to improve performance.

Host data from upstream interface 34 is re-ordered by reordering unit 516 in smart storage transaction manager 36. For example, host packets may be processed in different orders than received, such as shown later in packet re-ordering FIGS. 11-13. This is a very high-level of re-ordering.

Striping logic 518 can divide the host data into stripes that are written to different physical devices, such as for a Redundant Array of Inexpensive Disks (RAID). Parity and ECC data can be added and checked by ECC logic 520, while SLV installer 521 can install a new storage logical volume (SLV) or restore an old SLV. The SLV logical volumes can be assigned to different physical flash devices, such as shown in this FIG. for single-chip flash-memory devices 950-953, which are assigned SLV#1, #2, #3, #4, respectively.

Virtualization unit 514 virtualizes the host logical addresses and concatenates the flash memory in single-chip flash-memory devices 950-953 together as one single unit for efficient data handling such as by remapping and error handling. Remapping can be performed at a high level by smart storage transaction manager 36 using wear-level and bad-block monitors 526, which monitor wear and bad block levels in each of single-chip flash-memory devices 950-953. This high-level or presidential wear leveling can direct new blocks to the least-worn of single-chip flash-memory devices 950-953, such as single-chip flash-memory device 952, which has a wear of 250, which is lower than wears of 500, 400, and 300 on other single-chip flash-memory devices. Then single-chip flash-memory device 952 can perform additional low-level or governor-level wear-leveling among flash memory blocks 68 (FIG. 3) within single-chip flash-memory device 952.

Thus the high-level "presidential" wear-leveling determines the least-worn volume or single-chip flash-memory device, while the selected device performs lower-level or "governor" wear-leveling among flash memory blocks within the selected single-chip flash-memory devices. Using such presidential-governor wear-leveling, overall wear can be improved and optimized.

Endpoint and hub mode logic 528 causes smart storage transaction manager 36 to perform aggregation of endpoints for switch mode as described earlier for mode logic 26 of FIG. 1. Rather than use wear indicators, the percent of bad blocks can be used by smart storage transaction manager 36 to decide which of single-chip flash-memory devices 950-953 to assign a new block to. Single-chip flash-memory devices with a large percent of bad blocks can be skipped over. Small amounts of host data that do not need to be interleaved can use the less-worn single-chip flash-memory devices, while larger amounts of host data can be interleaved among all four single-chip flash-memory devices, including the more worn devices. Wear is still reduced, while interleaving is still used to improve performance for larger multi-block data transfers.

Figure 7:
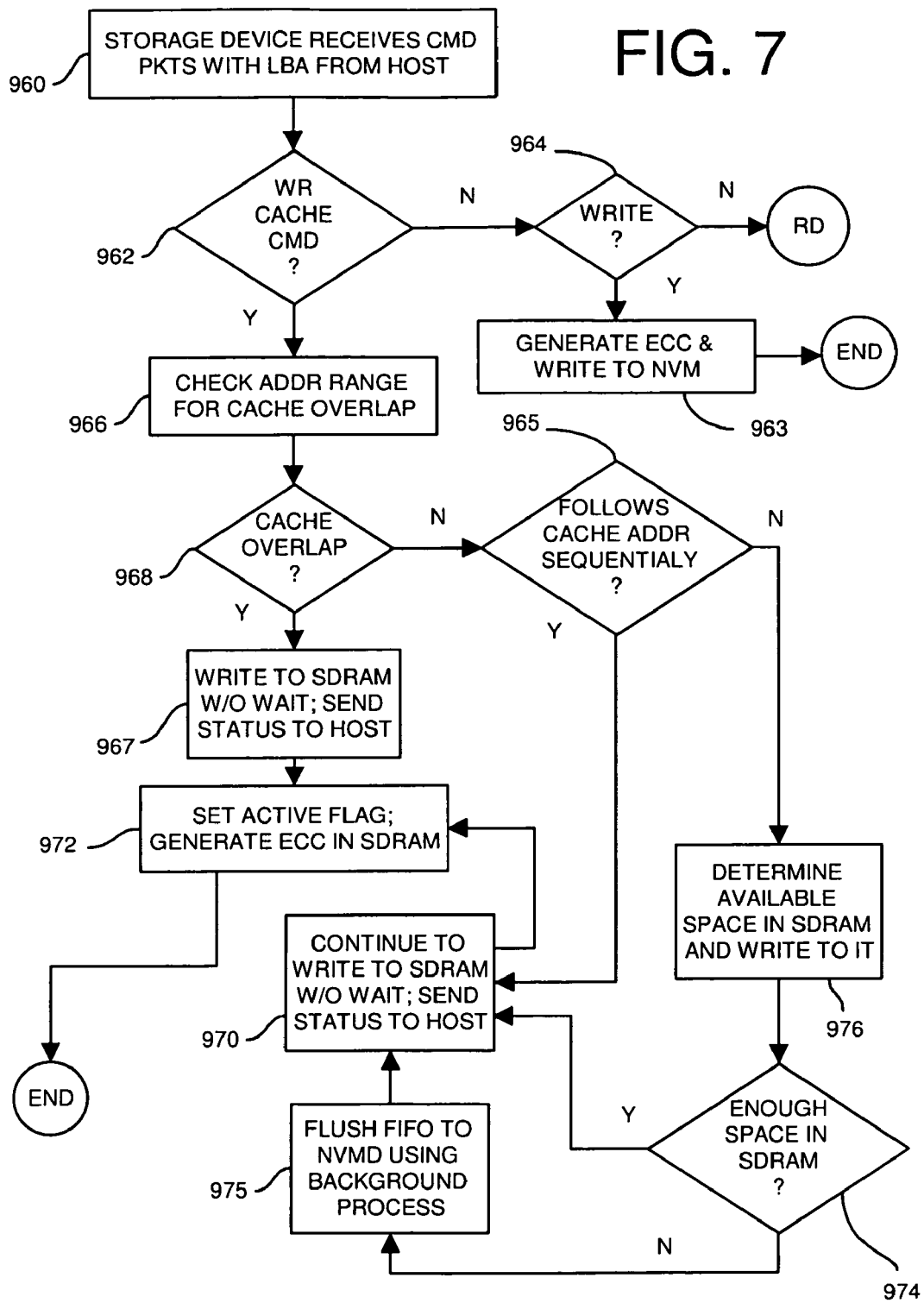
FIG. 7 is a flowchart of a write operation performed by the smart storage switch.

FIG. 7 is a flowchart of a write operation performed by the smart storage switch. Smart storage switch 30 (FIG. 3) receives a command packet from the host, step 960. This command packet contains the host's address, which is a logical address, such as a logical sector address (LSA) that contains the LBA, or can be used to locate the LBA. When this command packet indicates a read, step 962 and step 964 fail, and the process continues with the read flow of FIG. 8.

When the host command packet is for a write that is cacheable, step 962, then the smart storage switch compares the host address to addresses of data stored in the cache in SDRAM 60, step 966. If there is any overlap in the range of addresses being written by the host and data stored in the SDRAM cache, step 968, then the host data is immediately written to the SDRAM cache, and a successful status is sent to the host, step 967, once the data packets are received from the host. The active flag for the SDRAM cache is set to indicate that there is valid data in the cache that needs to be flushed to flash memory, and ECC is generated for the host data in the SDRAM cache, step 972.

When there is no overlap of the host address range with data in the cache, step 968, but the host address range follows a range of data already stored in the SDRAM cache, step 965, then the host data is written to the SDRAM after the range of data already stored in the SDRAM, and a successful status is sent to the host step 970. The active flag for the SDRAM cache is set to indicate that there is valid data in the cache that needs to be flushed to flash memory, and ECC is generated for the host data in the SDRAM cache, step 972. The data can be flushed from the SDRAM cache to the flash memory as a standard background process.

When there is no overlap of the host address range with data in the cache, step 968, and the host address range does not follow a range of data already stored in the SDRAM cache, step 965, then the host data is written to any available space in the SDRAM, step 976. This allows data to be stored in contiguous blocks in the SDRAM cache when possible. When there is not enough space in the cache, step 974, then the SDRAM is flushed to flash memory as a background process, step 975, and the process then continues by writing the host data to SDRAM with step 970 described earlier, which also occurs when there is enough space in the SDRAM cache in step 974.

When the host command is not a cacheable write, step 962, but is still a write, step 964, the ECC is generated for the host data and stored directly to the flash memory, step 963. Smart storage switch 30 must determine where to store the host data, since the host data may be re-mapped and stored in any of the single-chip flash-memory devices.

Figure 8:
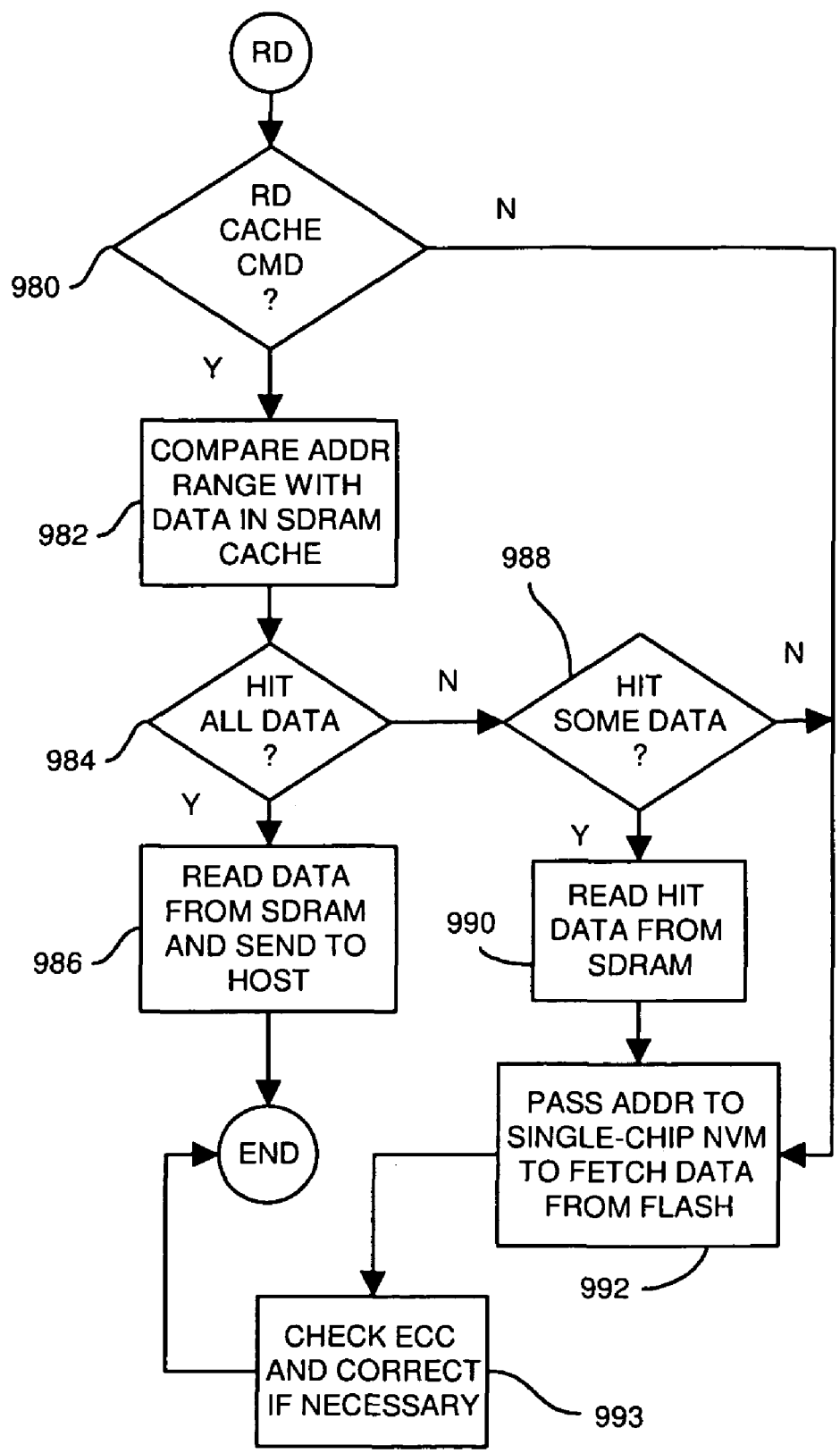
FIG. 8 is a flowchart of a read operation performed by the smart storage switch.

FIG. 8 is a flowchart of a read operation performed by the smart storage switch. Smart storage switch 30 (FIG. 3) receives a command packet from the host, step 960 of FIG. 7. When this is a read command packet and the command packet indicates that the read is cacheable, step 980, then the range of addresses in the host command is compared to addresses of data already in the cache, step 982. This compare may be performed by examining cache tags or using a cache directory. When all the requested read data hits in the SDRAM cache, step 984, then the data is read from the cache and sent to the host, step 968. When some of the host address range hits in the cache, but other addresses in the host's range of addresses miss the cache, step 988, then the overlapping hit data is read from the cache, while the non-overlapping requested data is read from flash memory, step 992. The parity or ECC is checked and corrections made, step 993. If corrections fail, a fail status is returned to the host.

When the host command is non-cacheable, step 980, or some or all of the requested data misses the cache, step 988, then the requested data is read from the flash memory, step 992. Smart storage switch 30 uses a map to locate the requested data in the flash memory, and sends a read request to the identified single-chip flash-memory device.

Figure 9:
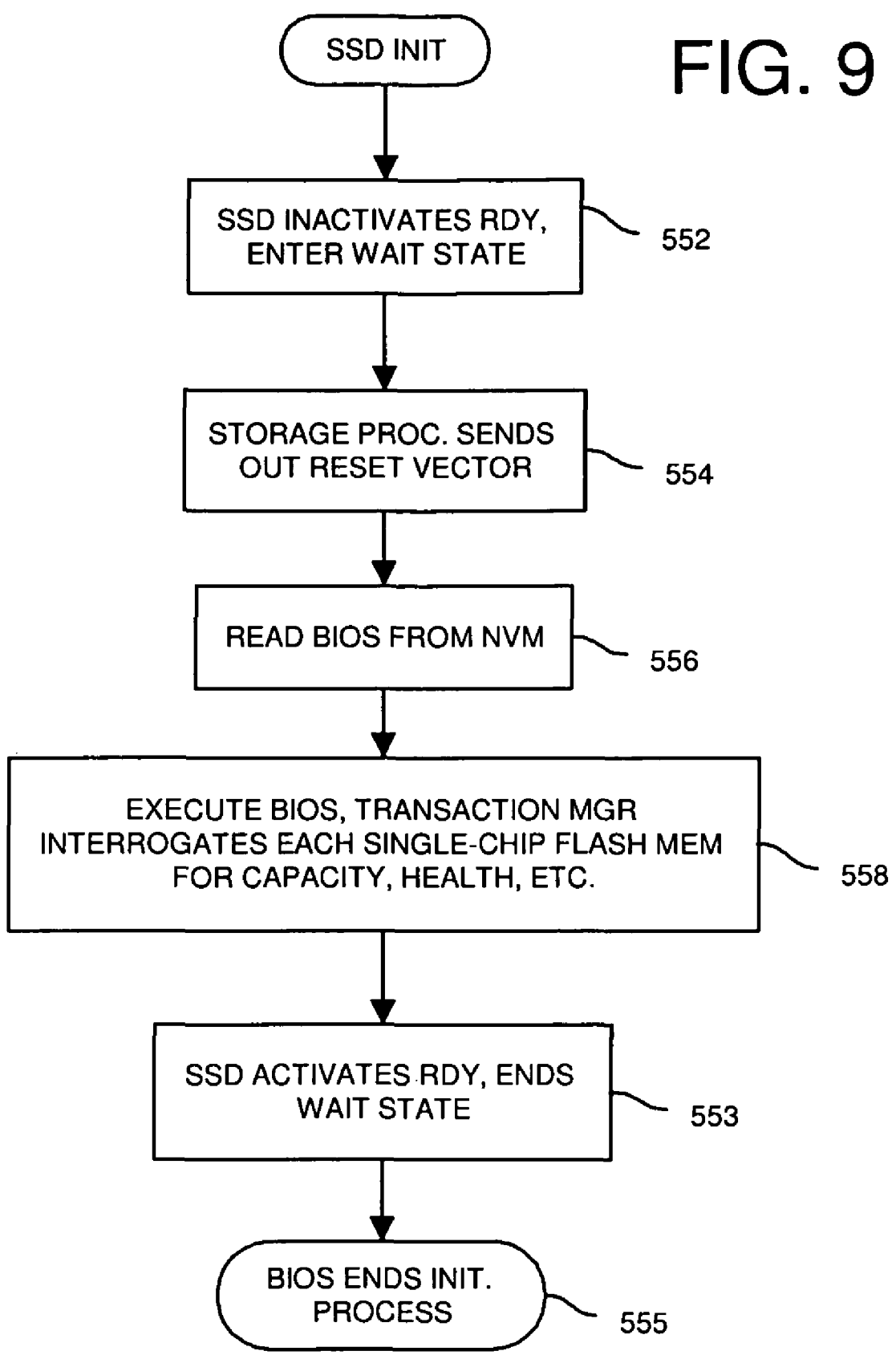
FIG. 9 is a flowchart of an initialization routine executed by the smart storage switch.

FIG. 9 is a flowchart of an initialization routine executed by the smart storage switch. When power is applied, or a reset occurs, smart storage switch 30 fetches and executes an initialization routine, such as one stored as firmware or in a ROM. The smart storage switch drives ready to the host inactive and enters a wait state, step 552. The storage processor, such as virtual storage processor 140 of FIG. 3, sends out a reset vector that is generated by hardware in response to a power-on signal, step 554. The storage processor then begins reading instructions stored in a ROM or other non-volatile memory, step 556. These instructions may be considered a Basic Input Output System (BIOS) for smart storage switch 30. Some of the BIOS may be stored in a small ROM, while other parts are stored in flash memory of single-chip flash-memory device 73.

As the BIOS instructions are executed by the storage processor, step 558, smart storage transaction manager 36 sends messages to each single-chip flash-memory device 73 to obtain responses that indicate the characteristics of each single-chip flash-memory device 73, such as their total capacity, timing, number of bad blocks, a failure counter, etc. The smart storage switch then activates ready to the host and ends its wait state, step 553. This returns control to the host.

Figure 10:
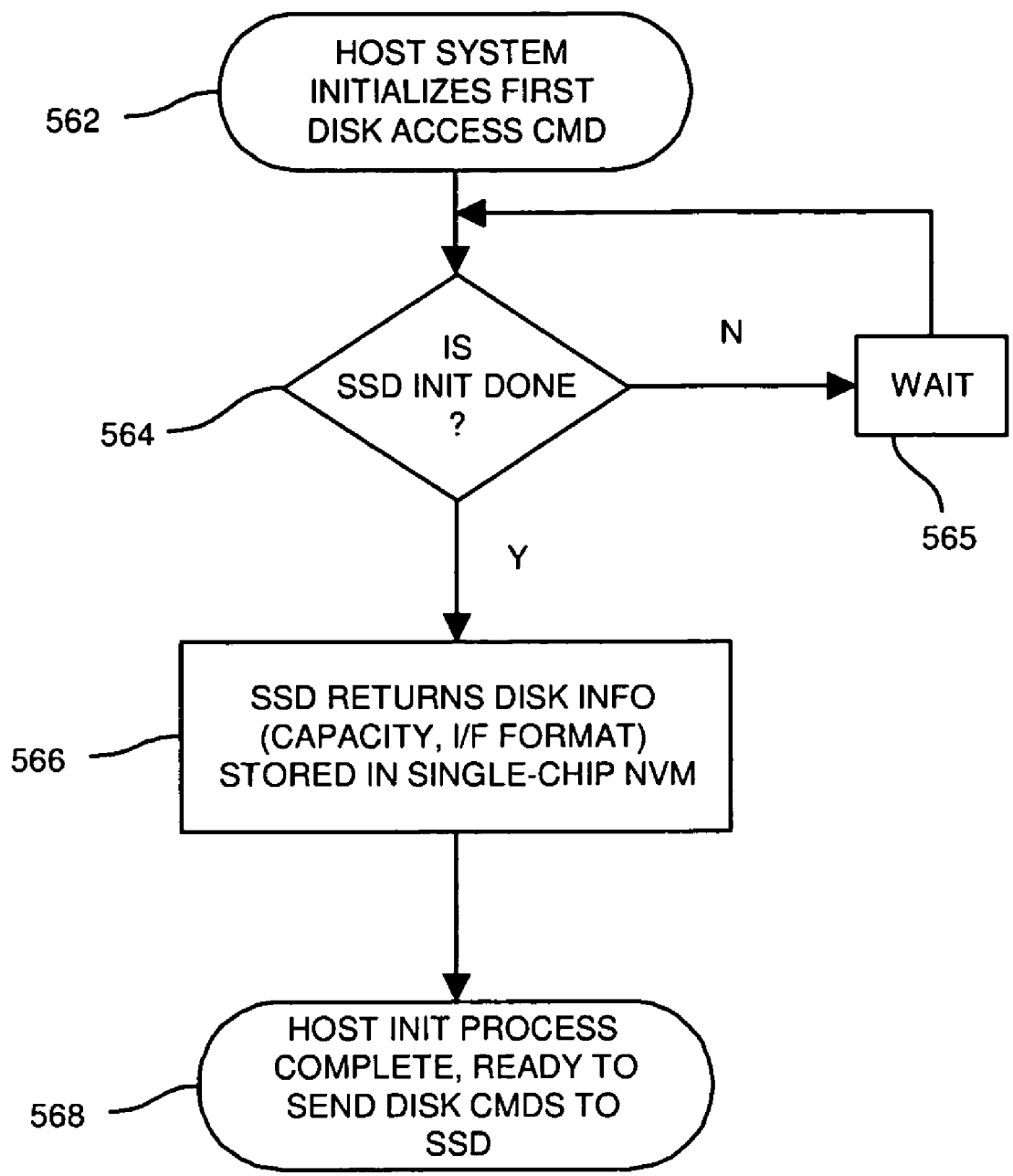
FIG. 10 is a flowchart of an initialization routine executed by the host that is connected to the smart storage switch.

FIG. 10 is a flowchart of an initialization routine executed by the host that is connected to the smart storage switch. When the host system is ready to initialize its peripherals so that it can access its mass storage devices such as rotating and flash disks, step 562, it checks to see that the solid state storage device containing smart storage switch 30 is ready, step 564. When the smart storage switch has not yet activated its ready signal, the host waits, step 565, and continues checking the ready, step 564.

Once the smart storage switch has finished its initialization routine of FIG. 9, it asserts or activates its ready signal to the host, and step 564 passes. The host can send a status request to the smart storage switch, causing the smart storage switch to return its status and characteristics, such as its total capacity, interface formats, etc., step 566. The smart storage switch totals or combines the capacities of all single-chip flash-memory device 73 controlled by it.

The host then completes its initialization process, step 568, and is ready to send read and write commands to the smart storage switch.

Figure 11:
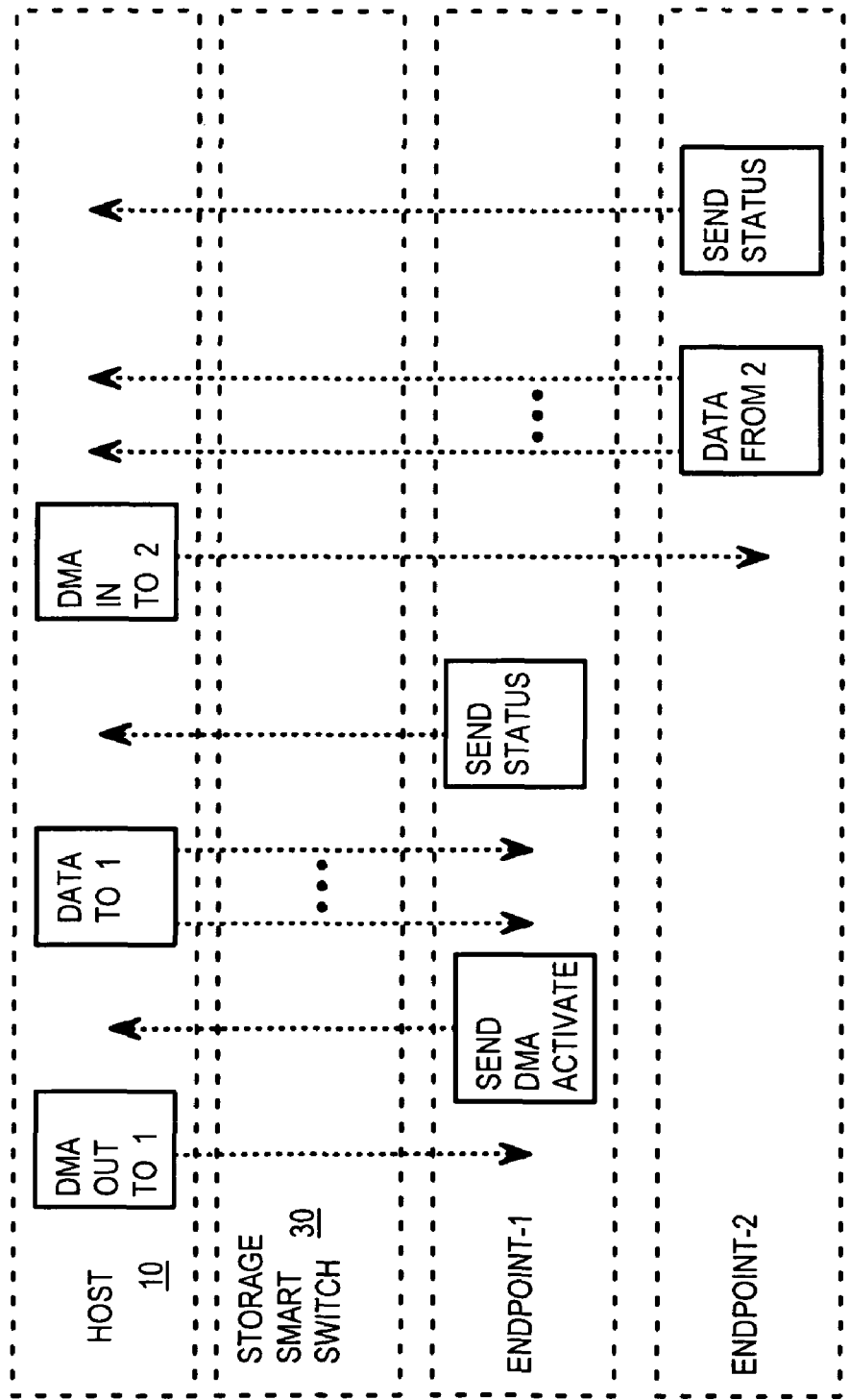
FIG. 11 is a packet-timing diagram of the smart storage switch operating in hub mode.

FIG. 11 is a packet-timing diagram of the smart storage switch operating in hub mode. Protocol-transfer software on host 10 schedules transactions to various protocol devices for each time frame. Host 10 sends a DMA_OUT command (non-data) packet to the flash memory device at endpoint 1. Smart storage switch 30 passes this packet through from host 10 to endpoint-1, which is first single-chip flash-memory device 73 of FIG. 3. This command packet implies a future write command to the flash block.

Single-chip flash-memory device 73 at endpoint-1 responds by setting up for the direct-memory access (DMA) transfer, and sends a DMA activate back to host 10 through smart storage switch 30 to indicate that it is ready for the DMA transfer to begin.

Next host 10 sends one or more data-out packets to endpoint-1, with the data to write into flash memory blocks in first single-chip flash-memory device 73. Smart storage switch 30 acts as a hub and passes this data packet through.

NVM controller 76 in first single-chip flash-memory device 73 then writes this data into its flash memory blocks 68 and responds with a status packet back to host 10. Smart storage switch 30 passes this status packet back to host 10.

Upon receiving the status packet from endpoint-1, host 10 then generates a second command packet DMA_IN that is sent to endpoint-2. Smart storage switch 30 passes this second command packet through to second single-chip flash-memory device 73, the second endpoint that is addressed by the command packet. This command packet contains a flash-read command and an address to begin reading from and a length to read, so NVM controller 76 instructs flash memory blocks 68 to begin reading the requested data.

After a read access time, the data is ready to be sent back to host 10. NVM controller 76 in second single-chip flash-memory device 73 packs the data into a data-in packet. The data-in packet is sent to host 10 and passes through smart storage switch 30. A final status packet is also generated by NVM controller 76 in second single-chip flash-memory device 73 to signal completion of the read command. The status packet is passed on to host 10 by smart storage switch 30.

Initiation of data read is delayed until the prior transaction completes. The host could use a split transaction for the write, but since the host software lacks detailed knowledge of the endpoints, any packet re-ordering would be inefficient.

Figure 12:
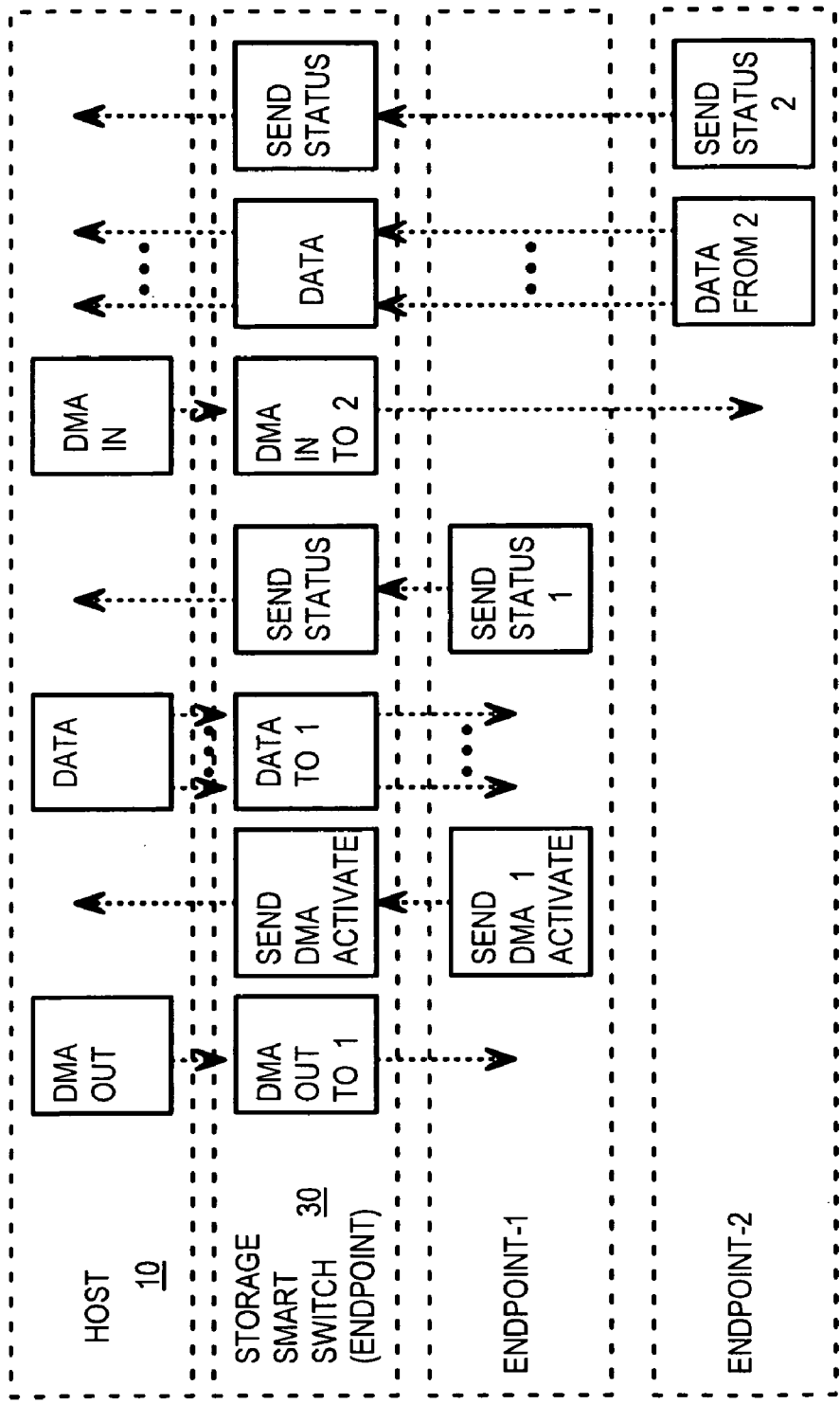
FIG. 12 is a timing diagram of packet ordering by the smart storage switch 30 in switch mode.

FIG. 12 is a timing diagram of packet ordering by the smart storage switch 30 in switch mode. Smart storage switch 30 acts as the single endpoint seen by host 10. The first DMA_OUT command packet with the command to write to flash storage is sent by host 10. Smart storage switch 30 determines which of the two single-chip flash-memory devices 73 to write, using a memory-mapping table of other memory-management techniques performed by Virtual storage processor 140 or other logic in smart storage transaction manager 36 (FIG. 3). Smart storage switch 30 then generates another DMA_OUT command packet to send on to first single-chip flash-memory device 73

Single-chip flash-memory device 73 at endpoint-1 responds by setting up for the direct-memory access (DMA) transfer, and sends a DMA activate to smart storage switch 30, which then sends a DMA activate back to host 10 to indicate that it is ready for the DMA transfer to begin.

Next host 10 sends one or more data-out packets to smart storage switch 30, which takes the data and forms one or more data-out packets to send to endpoint-1, with the data to write into flash memory blocks in first single-chip flash-memory device 73. Smart storage switch 30 acts as the endpoint to host 10, and as the host to endpoint-1.

NVM controller 76 in first single-chip flash-memory device 73 receives these data packets and then writes this data into its flash memory blocks 68 and responds with a status packet back to smart storage switch 30. Smart storage switch 30 generates its own status packet to send to host 10.

Upon receiving the status packet from endpoint-1, host 10 then generates a second command packet DMA_IN that is sent to endpoint-2. Smart storage switch 30 receives this packet, looks up the data's address, and determines that the data is stored in second single-chip flash-memory device 73. Smart storage switch 30 generates another second command packet that is sent to second single-chip flash-memory device 73, the second endpoint that is addressed by the host's command packet. This command packet contains a flash-read command and an address to begin reading from and a length to read, so NVM controller 76 instructs flash memory blocks 68 to begin reading the requested data.

After a read access time, the data is ready to be sent back to host 10. NVM controller 76 in second single-chip flash-memory device 73 packs the data into one or more data-in packets. These data-in packets are sent to smart storage switch 30, which buffers the data and forms other data-in packets to send host 10. A final status packet is also generated by NVM controller 76 in second single-chip flash-memory device 73 to signal completion of the read command. The status packet is sent to smart storage switch 30, which forms another status packet to send to host 10.

Figure 13A:
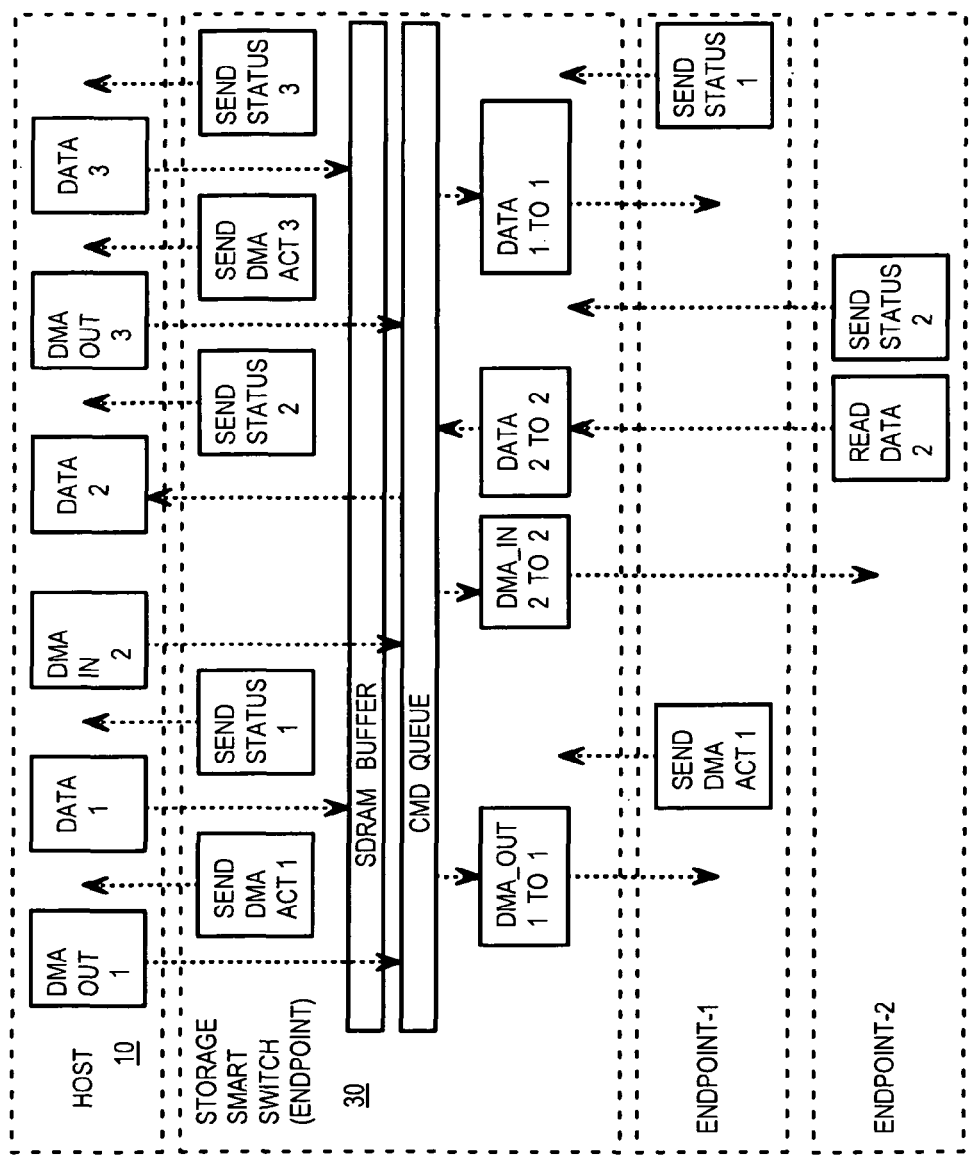
FIGS. 13A-B are a packet timing diagram of packet re-ordering by the smart storage switch.
Figure 13B:
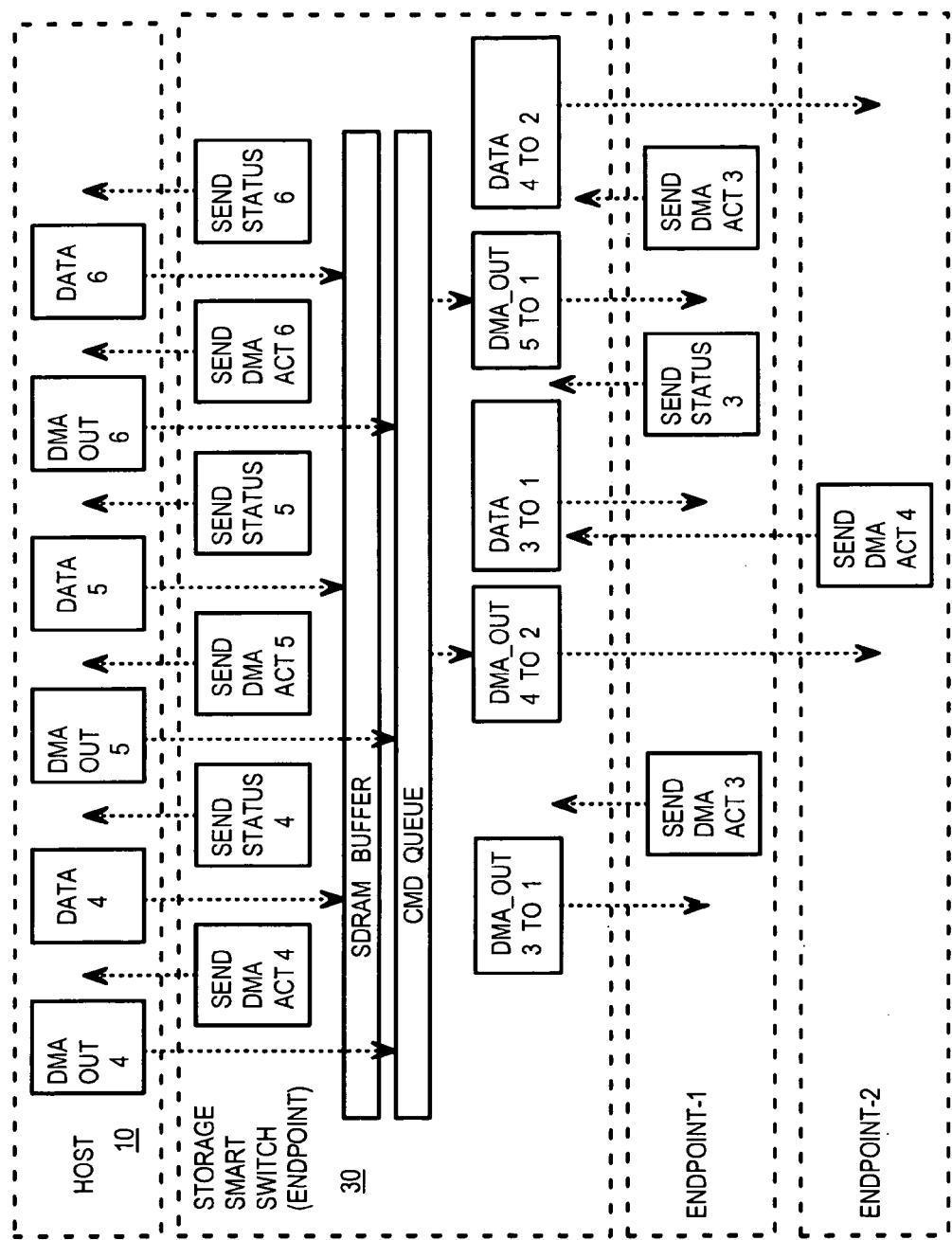

FIGS. 13A-B are a packet timing diagram of packet re-ordering by the smart storage switch. Reordering unit 516 (FIG. 6) in smart storage transaction manager 36 of smart storage switch 30 can re-order packets as shown in FIG. 13. to improve performance.

In hub mode, smart storage switch 30 simply copies packets from the upstream queue to the downstream queue (or vice-versa) in the same order. However, in switch mode, packets can be re-ordered to improve performance. In this example, the second command packet is re-ordered in the downstream queue before data is sent in response to the first command packet.

By re-ordering the second command packet ahead of the first data-out packet, reading of flash storage blocks in second single-chip flash-memory device 73 can begin earlier. This allows the read data to be ready earlier, so that the second transaction can end sooner. Data throughput can be improved using such packet re-ordering. In an actual system, the read access time can be longer than shown in this simplified diagram, causing a more significant delay that is reduced by re-ordering.

Due to buffering, packet transmissions from smart storage switch 30 may be delayed relative to packet reception more than what is shown in the figures. A shift or delay at smart storage switch 30 may occur but is not shown in the diagrams to improve clarity of understanding basic concepts.

The host sends the first command packet with the DMA_OUT command to device 1. This first command is stored in the command queue of smart storage switch 30, which later sends a DMA_OUT (1 to 1) command to endpoint-1. Smart storage switch 30 generates a DMA_activate packet back to host 10. Host 10 responds with the data-out packet with the write data, DATA-1, which is stored in the SDRAM buffer of smart storage switch 30. Once the data is stored in the SDRAM buffer, smart storage switch 30 generates a status packet to host 10 indicating that the first DMA transfer completed, even though the data has not yet been written to flash memory.

Upon receipt of the first status packet, the host begins the second transaction with the second command packet with the DMA_IN read command. Smart storage switch 30 puts this command into its command queue. Since the read command is more time critical than the first write command in the command queue, smart storage switch 30 re-orders the first and second command from the host. Smart storage switch 30 looks up the host address from the second command packet and determines that the second single-chip flash-memory device 73 has the requested data. Smart storage switch 30 generates a DMA_IN read packet that is sent to endpoint-2 ahead, before the first data DATA-1 is sent to the first endpoint.

The second flash device can begin reading the requested data early, and sends it back to smart storage switch 30 in the data-in packet, which is followed by the second status packet that ends the second transaction. Smart storage switch 30 buffers the data and send data-in packets back to the host, followed by a second status packet to end the second transaction with the host.

The second command packet that begins access of the second flash storage device is placed before the first data-out packet and the first status packet from first single-chip flash-memory device 73. This allows the read of the second flash storage device to begin earlier. Physical completion of the data write to the first flash storage device is delayed somewhat, but this is usually not a serious performance issue.

Further DATA_OUT packets from the host are received in FIG. 13B, which are buffered by smart storage switch 30. Smart storage switch 30 interleaves the new host data by alternately assigning first and second single-chip flash-memory device 73 to receive these data. While writing of the physical flash blocks is slow, the response of smart storage switch 30 to host 10 is rapid, once the data is buffered by smart storage switch 30.

FIGS. 14A-F show various arrangements of data stored in the flash storage blocks. Data from the host may be divided into stripes by striping logic 518 in FIG. 6 and stored in different single-chip flash-memory devices 73, or in different flash memory blocks 68 within one single-chip flash-memory device 73. The host's Operating System writes or reads data files using a cluster (such as 4K Bytes in this example) as an address tracking mechanism. However during a real data transfer, it is based on a sector (512-Byte) unit. For two-level data-striping, smart storage switch 30 accounts for this when issuing to physical flash memory pages (the programming unit) and blocks (the erasing unit).

Figure 14A:
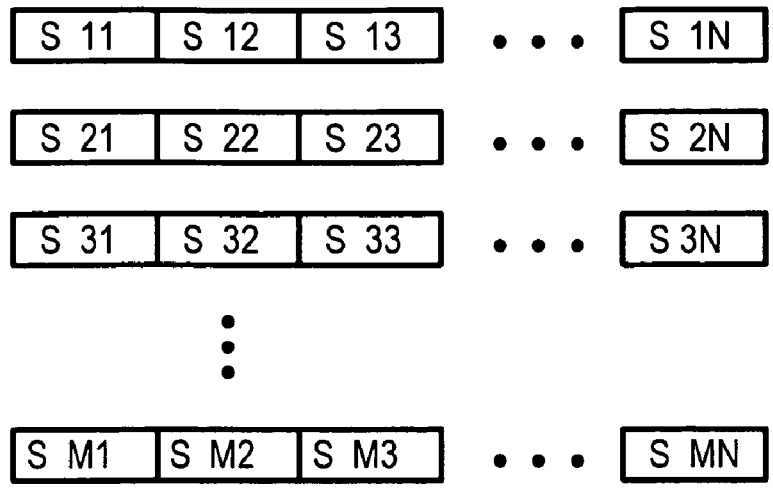

In FIG. 14A, data is arranged in a conventional linear arrangement. The data sequence received from the host in this example is S11, S12, S13, . . . , S1N, then S21, S22, S23, . . . , S2N, with SMN as the last data. In an actual system, the LBA addresses may not start from S11. For example, S13 may be the first data item. The last data item may not end with SMN. For example. SM3 may be the last data item. Each N-token data item has four times as many pages as is stored in a memory location that is physically on one flash storage device, such as 4×2K, 4×4K, 4×8K etc. Details of each token's data item are described later. A total of M data items are stored, with some of the data items being stored on different flash storage devices. When a failure occurs, such as a flash-memory chip failing to return data, the entire data item is usually lost. However, other data items stored on other physical flash-memory chips can be read without errors.

Figure 14B:
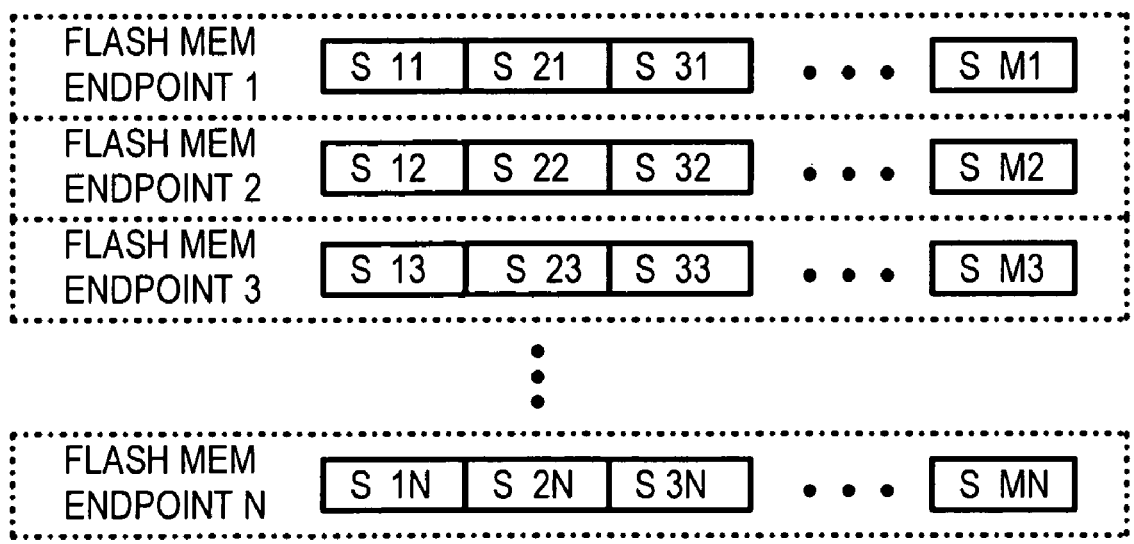

In FIG. 14B, data is striped across N flash-storage segments. Each data item is distributed and stored in the N flash-storage segments. For example, the first N-token data item consists of tokens 11, 12, 13, . . . 1N. The data item has token II stored in segment 1, token 12 stored in segment 2, . . . , and token 1N stored in segment N. Data items can fill up all segments before starting to fill the next round. These data items may be stripes that are sectors or pages, or are aligned to multiple sectors or multiple pages.

In FIG. 14C, data striping is performed across multiple storage segments with parity. The flash storage blocks are partitioned into N+1 segments. The N+1 segments are equal size, and the parity segment is sufficiently large in size to hold parity or error-correcting code (ECC) for the other N segments.

Each data item is divided into N portions with each portion stored on a different one of the N segments. The parity or ECC for the data item is stored in the parity segment. For example, an N-token data item consists of tokens 11, 12, 13, . . . 1N. The data item has token 11 stored in segment 1, token 12 stored in segment 2, token 13 stored in segment 3, . . . and token N stored in segment N. The parity or ECC is stored in the parity segment as token 1P.

In the diagram, each data item is stored across all segments as a vertical stripe. If one segment fails, most of the data item remains intact, allowing for recovery using the parity or ECC segment.

FIG. 14D shows other alternate data striping arrangements by using two segments for parity and ECC. Two segment dimension ECC or parity has two different methods of error detection/correction. A simple example is having one dimension using a hamming code, while the second dimension is a Reed-Solomon method or a BCH method. Two segment dimension parity and ECC can protect data in case any two single-chip flash-memory devices 950 fail in the middle of an operation. A single-chip flash-memory device 950 that is close to failure may be replaced before failing to prevent a system malfunction. FIGS. 14E and 14F are the similar to FIGS. 14C and 14D with distributed parity on all segments instead of concentrated on one or two segments to avoid heavy usage on the parity segments.

Errors may be detected and corrected through two-level error checking and correction. Each storage segment, including the parity segment, has a page-based ECC with its local controller. When a segment page is read, bad bits can be detected and corrected according to the strength of the ECC code, such as a Reed-Solomon code. In addition, the flash storage segments form a stripe with parity on one of the segments. Assume there are four storage segments F(1), F(2), F(3), F(4) and one parity segment F(P). These five segments form even parity stored on F(P). Each segment has its own independent ECC to do the first level of error detection and correction at a local level of each segment. If the first level ECC fails correction on segment F(2), the corresponding striping token information on F(1), F(3), F(4) and F(P) are sufficient to recover what the token information should be on F(2). The two levels of ECC make for a more completed error checking and correction.

As shown in FIGS. 14C-F, data can be stored in the flash storage segments with extra parity or ECC segments in several arrangements and in a linear fashion across the flash storage segments. Also, data can be arranged to provide redundant storage, which is similar to a redundant array of independent disks (RAID) system in order to improve system reliability. Data is written to both segments and can be read back from either segment.

Figure 15:
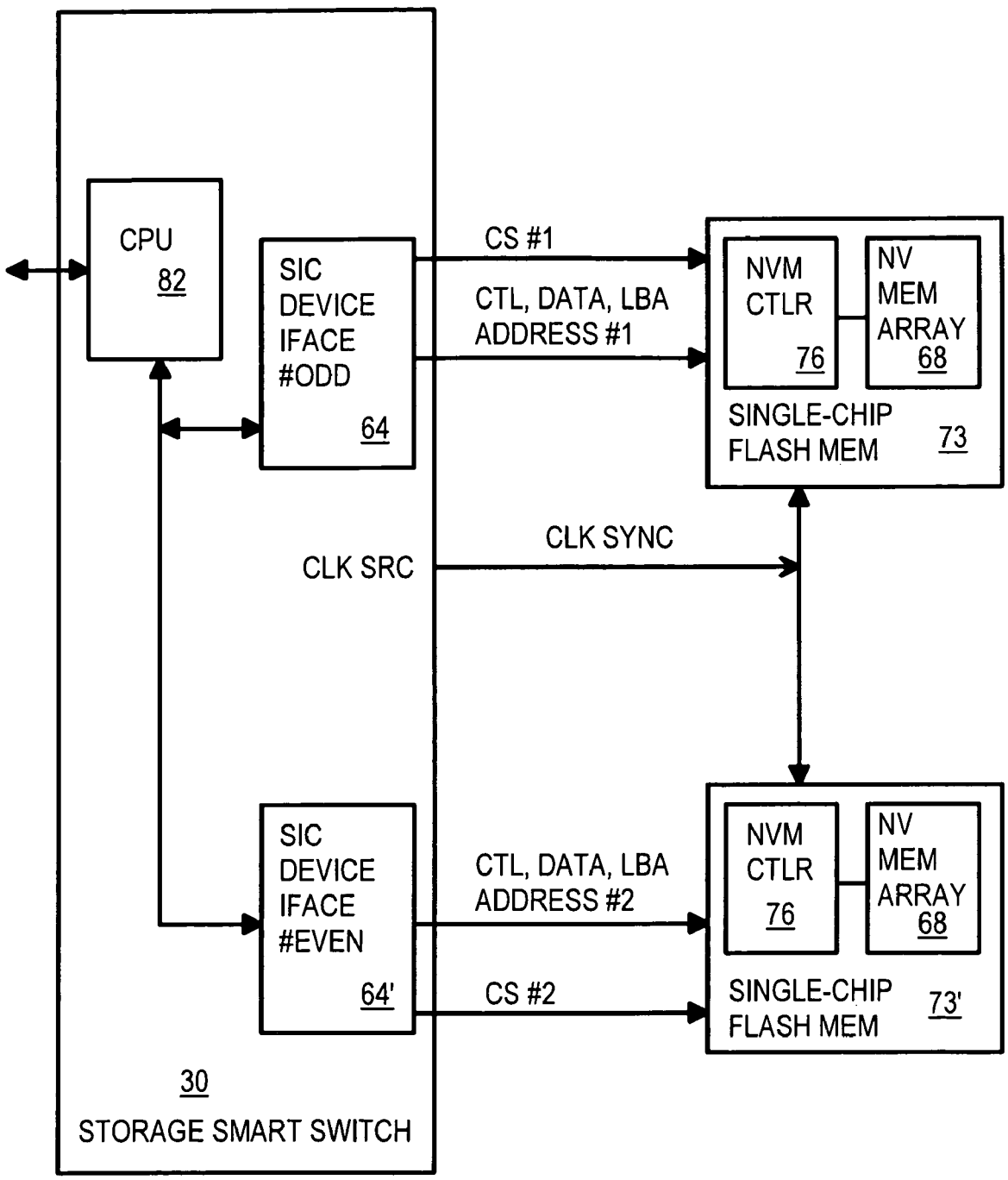
FIG. 15 highlights multi-channel access among two channels of flash using the smart storage switch.

FIG. 15 highlights multi-channel access among two channels of flash using the smart storage switch. An internal bus in smart storage switch 30 connects to multiple flash channel interfaces 64, 64'. CPU 82 is a processor such as virtual storage processor 140 in FIG. 3, or another processor that receives and decodes requests sent over the internal bus.

Each single-chip flash-memory device 73, 73' may have multiple channels of flash memory blocks 68 within. CPU 82 sends some requests to first flash channel interface 64, for data stored in flash memory blocks 68 in first single-chip flash-memory device 73, while other requests are sent by CPU 82 to second flash channel interface 64', for data stored in flash memory blocks 68 in second single-chip flash-memory device 73'.

First flash channel interface 64 generates interleaved control, data, and addresses #1 and device select CS#1 that address and enable first single-chip flash-memory device 73. Write data may be buffered before being written into flash memory blocks 68 by single-chip flash-memory device 73. Second flash channel interface 64' generates interleaved control, data, and addresses #2 and device select CS#2 that address and enable second single-chip flash-memory device 73.

A clock source is applied to both single-chip flash-memory devices 73, 73'. This clock synchronizes data transfers with flash channel interfaces 64, 64'. Synchronous bus transfers are performed over the two channels. Entire blocks, rather than pages, are sent over the flash channels, and LBA'S, rather than PBA's are used in the flash channels from smart storage switch 30. However, PBA's are used within single-chip flash-memory device 73 between NVM controller 76 and flash memory blocks 68.

President-Governor Wear-Leveling

Wear-Leveling is handled on multiple levels using a president-governor scheme. Smart storage switch 30 controls overall power policy for all single-chip flash-memory devices 73, 73' for all flash channels. The policy set at the President level is carried out at the Governor level by NVM controllers 76, in each of single-chip flash-memory devices 73, 73'. For example, smart storage switch 30 can reduce future wear to a channel by instructing single-chip flash-memory device 73 to more aggressively reduce wear, or by assigning new blocks to other channels.

Figure 16:
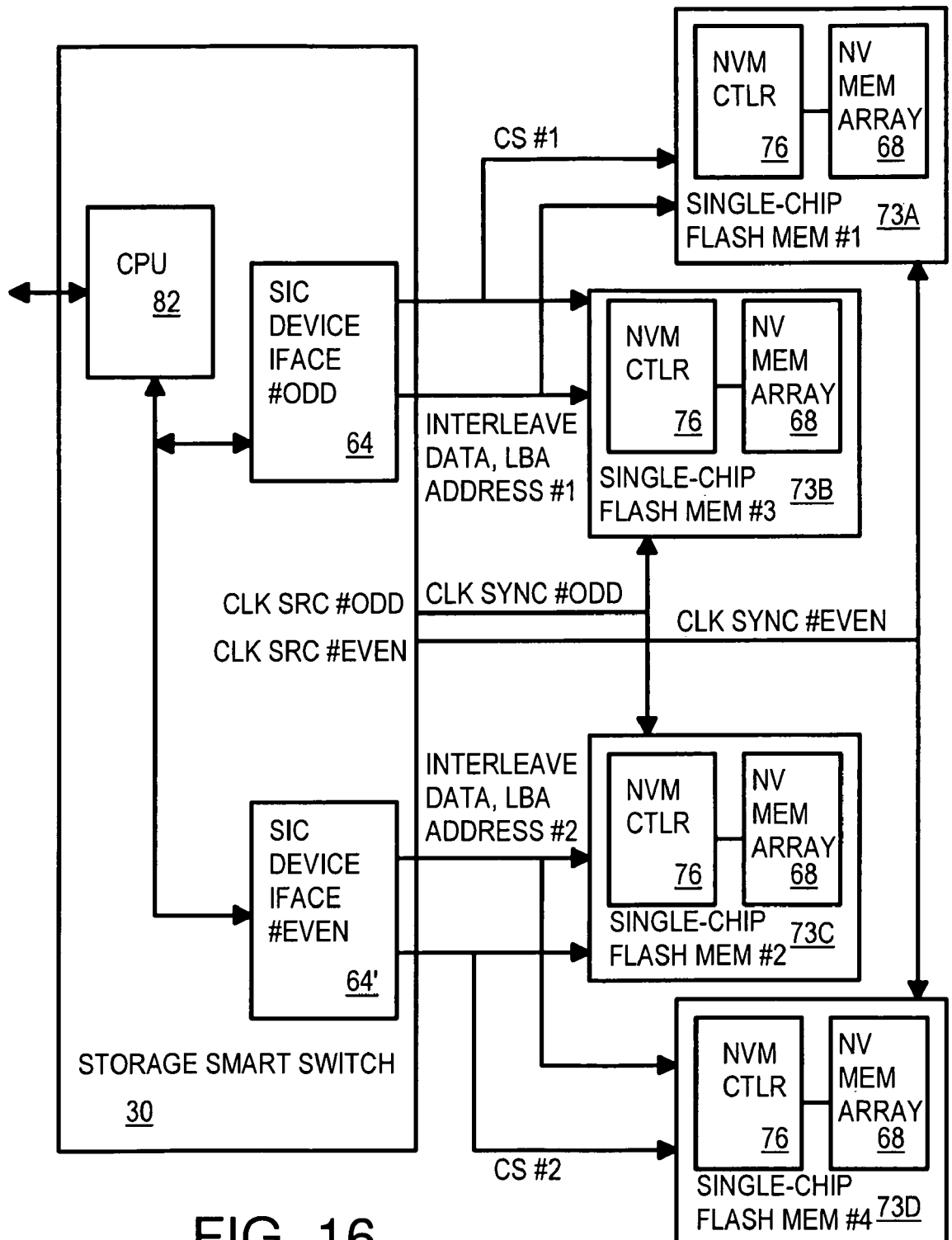
FIG. 16 highlights interleaving among two channels of flash using a smart storage switch and single-chip flash-memory devices.

FIG. 16 highlights interleaving among two channels of flash using a smart storage switch and single-chip flash-memory devices. An internal bus in smart storage switch 30 connects to multiple flash channel interfaces 64, 64' for odd and even interleaves. CPU 82 is a processor such as virtual storage processor 140 in FIG. 3, or another processor that receives and decodes requests sent over the internal bus.

Each single-chip flash-memory device 73A-73D may have multiple channels of flash memory blocks 68 within. CPU 82 sends some requests to first flash channel interface 64, for data stored in flash memory blocks 68 in first and second single-chip flash-memory devices 73A, 73B, while other requests are sent by CPU 82 to second flash channel interface 64', for data stored in flash memory blocks 68 in third and fourth single-chip flash-memory device 73C, 73D.

First flash channel interface 64 generates interleaved control, data, and addresses #1 and device select CS#1 that address and enable first and second single-chip flash-memory devices 73A, 73B, one at a time. Second flash channel interface 64' generates interleaved control, data, and addresses #2 and device select CS#2 that address and enable third and fourth single-chip flash-memory devices 73C, 73D.

Two clock sources are used. Clock source #ODD drives first clock CLK SYNC #ODD to second and third single-chip flash-memory devices 73B, 73C, while clock source #EVEN drives second clock CLK SYNC #EVEN to first and fourth single-chip flash-memory devices 73A, 73D. The two clocks may be non-overlapping in time, allowing selection between single-chip flash-memory devices 73A, 73B in the first channel, or among single-chip flash-memory devices 73C, 73D in the second channel. One clock source may be stopped while the other clock is being pulsed. The clock sources could also be used with an interleave select signal or an address bit.

Figure 17:
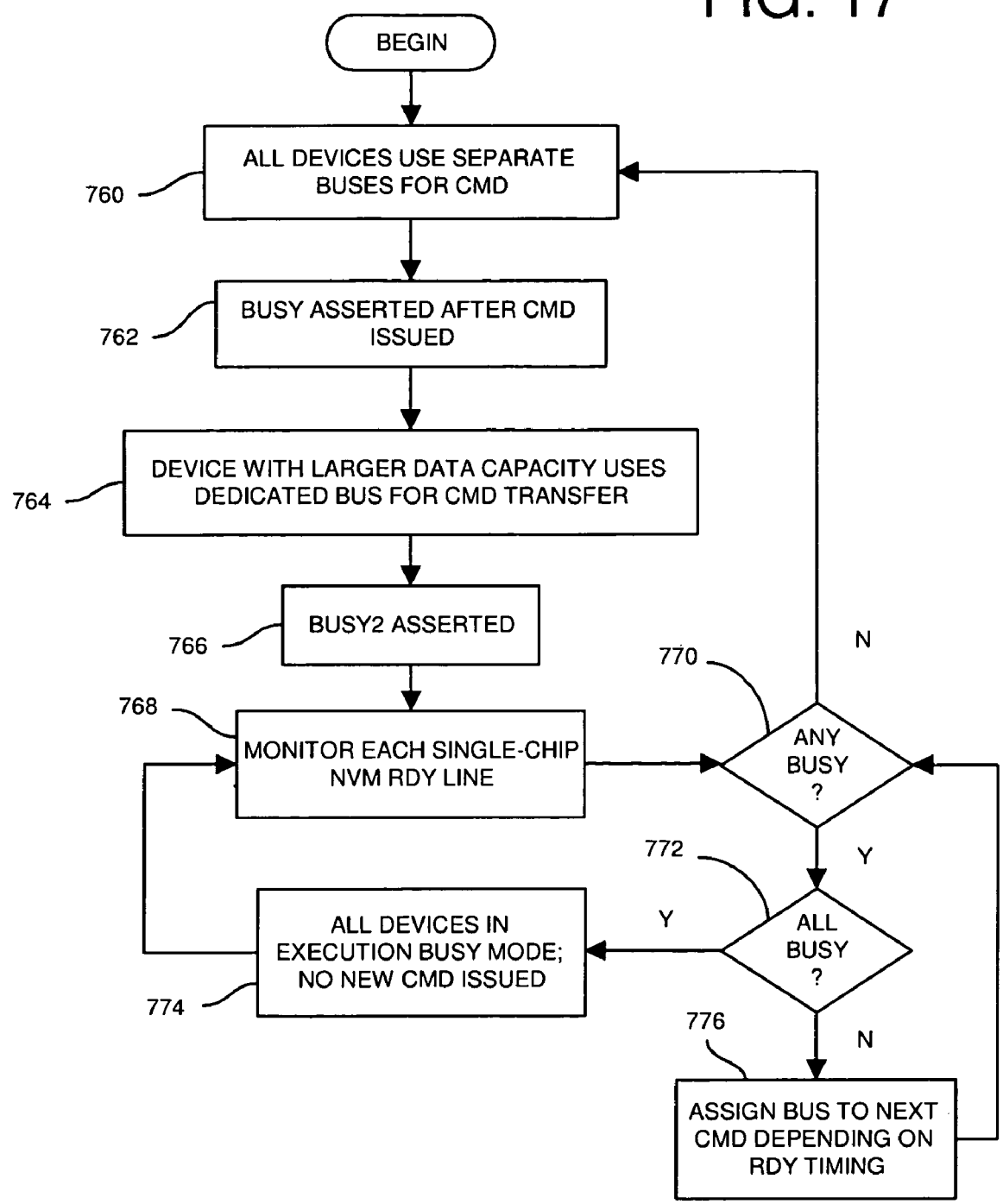
FIG. 17 is a flowchart of busy handling for multiple channels of flash.

FIG. 17 is a flowchart of busy handling for multiple channels of flash. When multiple channels of single-chip flash-memory devices 73 are present, such as shown in FIG. 15, all single-chip flash-memory devices use separate command and data buses, step 760. Busy is asserted to smart storage switch 30 by single-chip flash-memory device 73 after a command is received, step 762. The ready/not-busy signal can be a single line that is driven high to indicate ready (not busy), and low to indicate not ready (single-chip flash-memory device 73 is busy processing a command). R/B# can be an open-drain signal that allows and device to pull it low (wired or), with a pull-up resistor or weak driver used to maintain a high level when no device is pulling the busy line low.

Busy2 indicates that another target is also busy programming data into its physical flash media. However the bus is not occupied due to the dual bus structure. The interleave scheme uses this bus-free mechanism to take advantage of the available bus.

The single-chip flash-memory device 73 with the larger data capacity uses its dedicated bus to receive a command from smart storage switch 30, step 764. Smart storage switch 30 can first send a command to the larger capacity device before sending a command to lower capacity devices. BUSY2 on LBA buses 28 (FIG. 3) is asserted by single-chip flash-memory device 73, step 766.

The smart storage switch monitors the ready lines from each single-chip flash-memory devices 73, step 768. When none of the busy lines are asserted, step 770, then the commands have been completed. Writes to flash memory are done, and the next host command can be processed, step 760.

When all single-chip flash-memory devices 73 are still busy, step 772, then smart storage switch 30 cannot issue another command, step 774. Smart storage switch 30 continues to monitor the ready lines, step 768.

When one of the ready lines indicates that one of single-chip flash-memory devices 73 is no longer active, step 772, then smart storage switch 30 can assign that single-chip flash-memory device 73 to another new command after a time needed by the pull-up resistor to pull the ready line high, step 776. Smart storage switch 30 then continues to monitor the ready lines, step 770.

Figure 18:
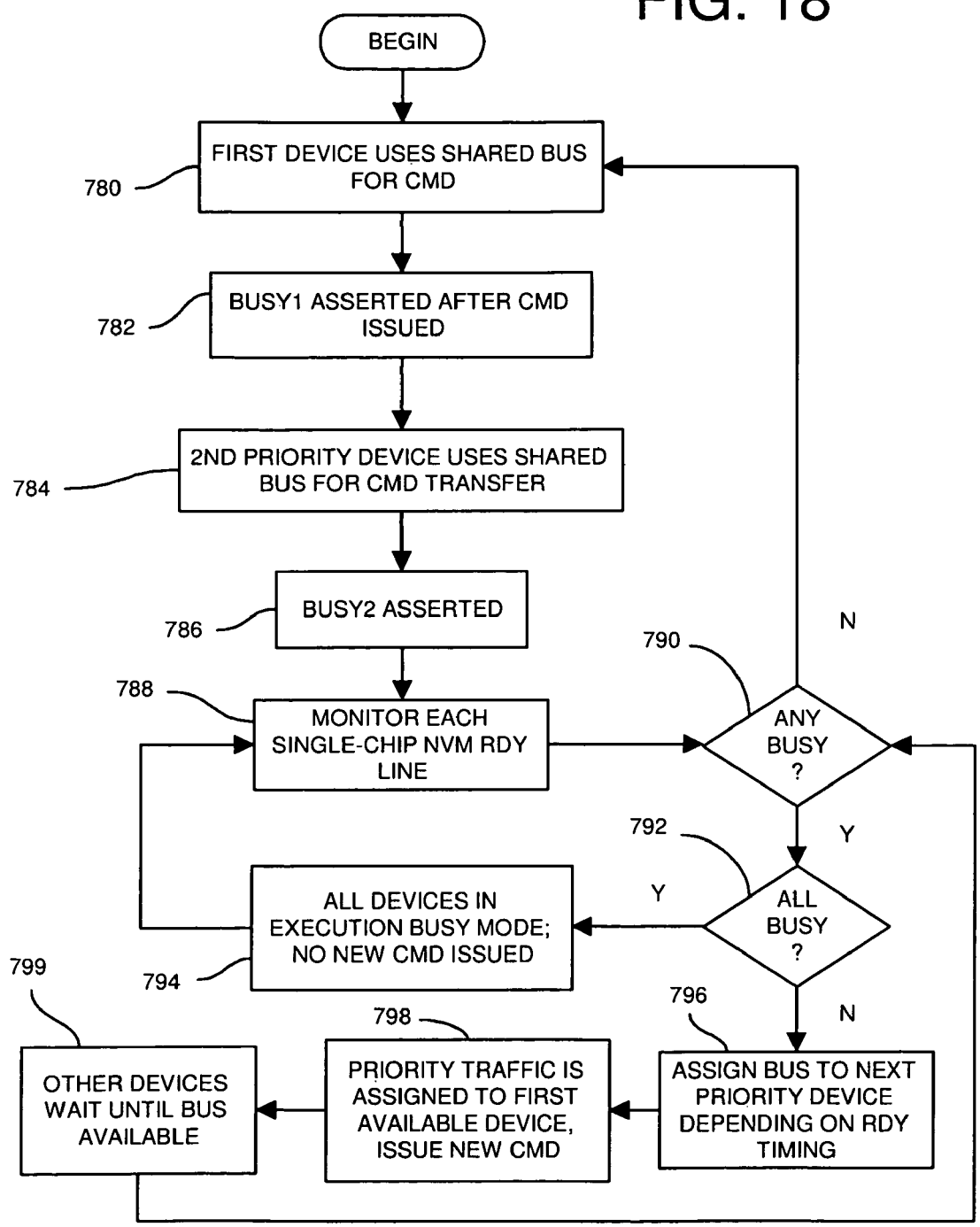
FIG. 18 is a flowchart of busy handling for multiple interleaved channels of flash.

FIG. 18 is a flowchart of busy handling for multiple interleaved channels of flash. When multiple channels of single-chip flash-memory devices 73 are interleaved, such as shown in FIG. 16, all single-chip flash-memory devices within an interleave share command and data buses, step 780. Only one single-chip flash-memory device 73 in each interleave can receive a command at a time over the shared command buses.

Busy1 is asserted to smart storage switch 30 by single-chip flash-memory device 73 after a command is received, step 782. Busy1 in step 782 is generated by the first single-chip flash-memory device 73 while busy2 in step 786 is generated by the second single-chip flash-memory device 73. Busy1 and Busy2 are connected together as the shared busy line.

The single-chip flash-memory device 73 in the other interleave (such as 73C, 73D in FIG. 16) with the lower priority, or that starts programming later, uses its dedicated bus to receive a command from smart storage switch 30, step 784. Smart storage switch 30 can first send a command to a device in the first interleave of devices 73A, 73B before sending a command to devices 73C, 73C in the second interleave. BUSY2 on LBA buses 28 (FIG. 3) is asserted by single-chip flash-memory device 73, step 786.

The smart storage switch monitors the ready lines from each single-chip flash-memory devices 73, step 788. When none of the busy lines are asserted, step 790, then the commands have been completed. Writes to flash memory are done, and the next host command can be processed, step 780.

When all single-chip flash-memory devices 73 are still busy, step 792, then smart storage switch 30 cannot issue another command, step 794. Smart storage switch 30 continues to monitor the ready lines in both interleaves, step 788.

When one of the ready lines indicates that one of single-chip flash-memory devices 73 is no longer active, step 792, then smart storage switch 30 can assign that single-chip flash-memory device 73 to another new command, step 796. Commands are prioritized and possibly re-ordered by smart storage transaction manager 36, and assigned to the available device, step 798. Other devices in the same interleave must wait until their interleave's bus is available, step 799. Smart storage switch 30 then continues to monitor the ready lines, step 790.

Figure 19A:
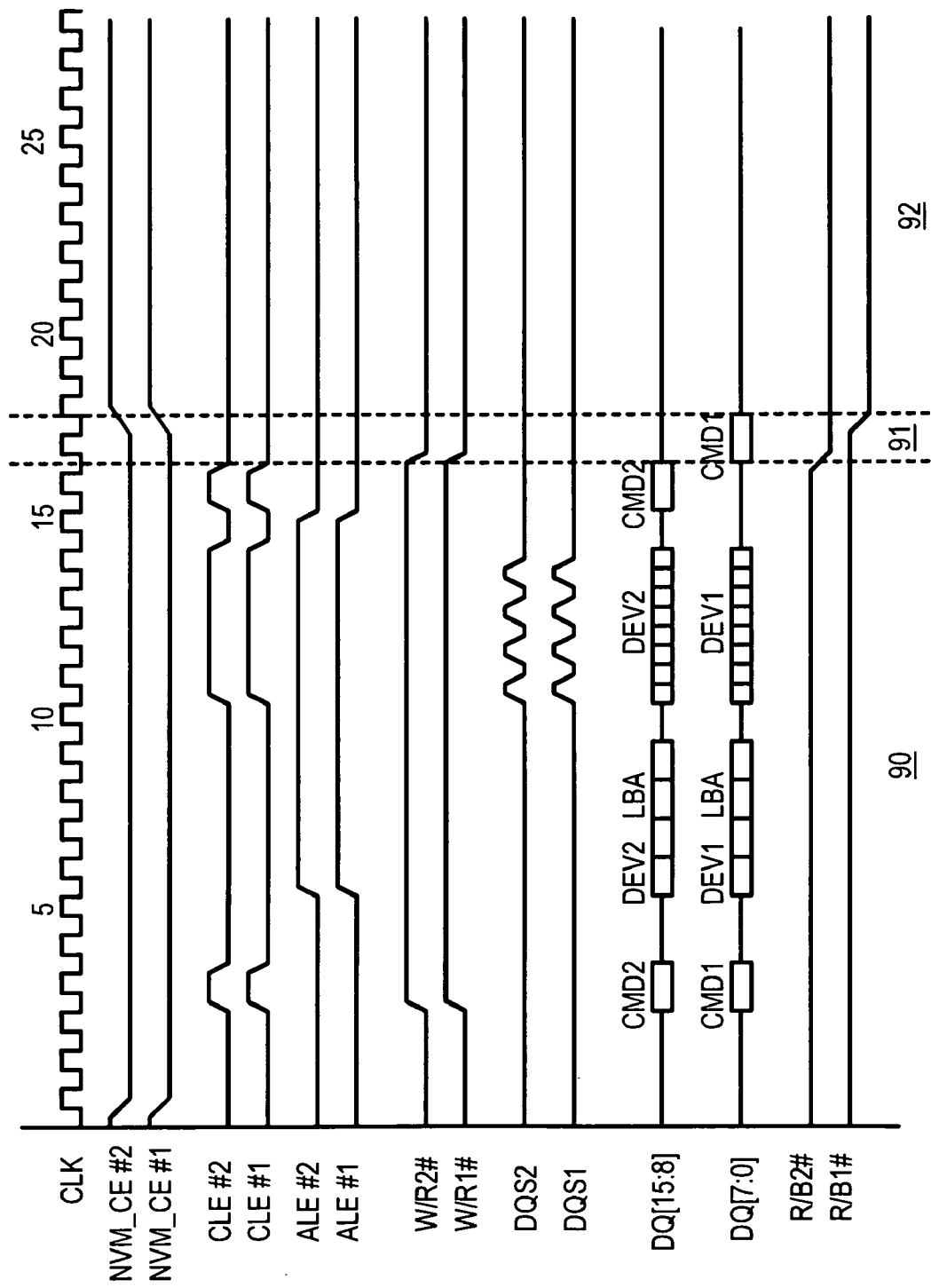
FIGS. 19A-B show timing waveforms of access by the smart storage switch to multiple channels of single-chip flash-memory devices.
Figure 19B:
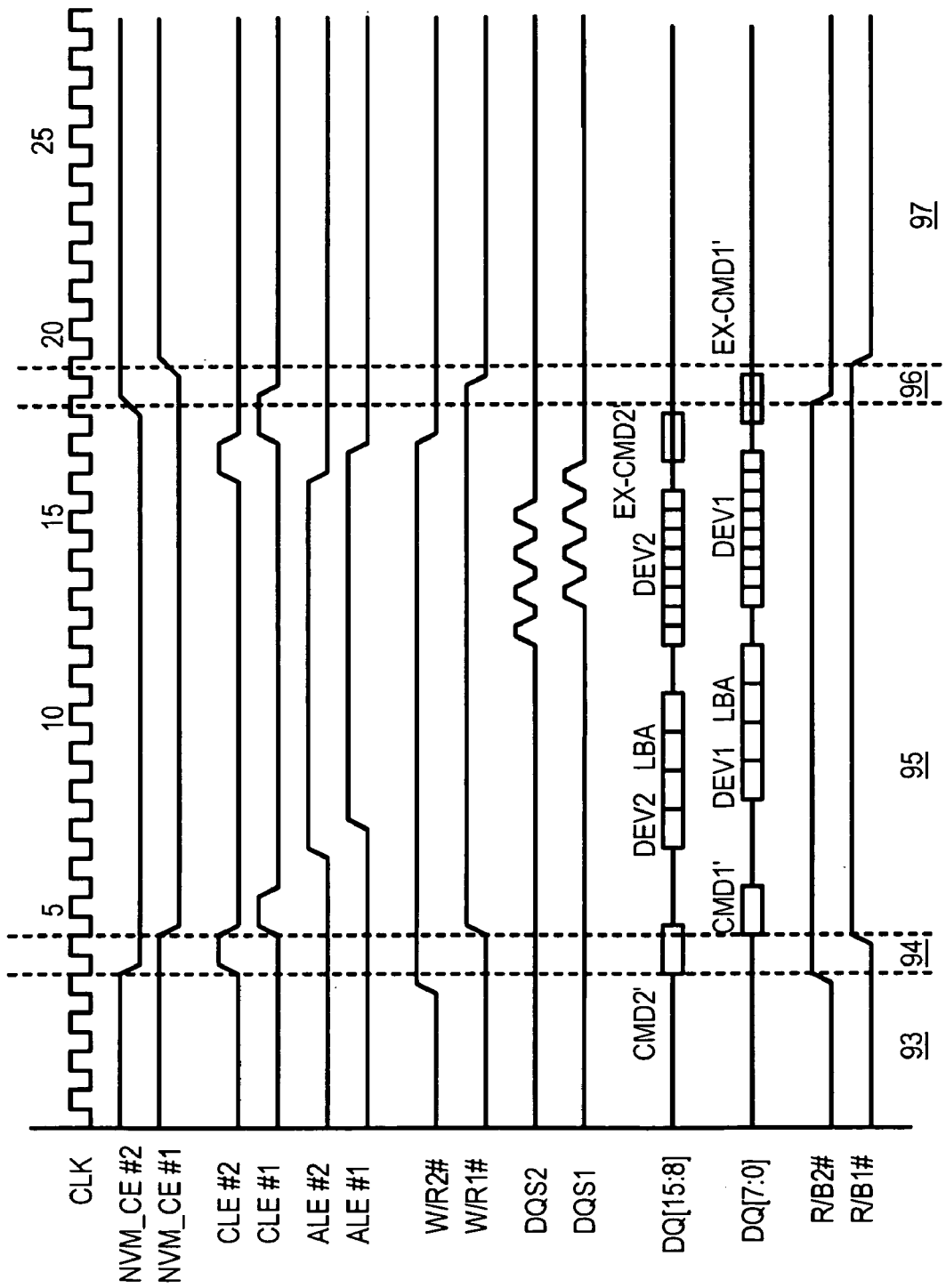

FIGS. 19A-B show timing waveforms of access by the smart storage switch to multiple channels of single-chip flash-memory devices. The flow of FIG. 17 and the architecture of FIG. 15 correspond to this timing.

Since two single-chip flash-memory devices 73 have separate command and data buses for their own dedicated use, both single-chip flash-memory devices 73 may be accessed at the same time. In FIG. 19A, chip enables CE to both single-chip flash-memory devices are asserted low to begin access cycles, and separate commands CMD1, CMD2 are latched in using command-latch-enable CLE lines and separate addresses DEV2 LBA and DEV1 LBA are latched in using separate address-latch-enable ALE signals. Write data from the host and buffered by smart storage switch 30 (DEV2, DEV1 on DQ data buses) is latched into the single-chip flash-memory devices using data strobes DQS2, 1. These two accesses occur simultaneously during time period 90.

During time 91, two new commands CMD2, CMD1 are latched in using command-latch-enable signals CLE2, CLE1. These can be status packets or commands.

After busy times 92, 93, in FIG. 19B during time 94 two more commands are latched in with a slight delay offset to each other. During time 95, addresses and data are latched in, and status or completion messages are sent during time 96 before busy time 97.

Ready is driven low to indicate that single-chip flash-memory devices 73 are busy during times 92, 93, 97, when single-chip flash-memory devices 73 are internally writing to flash memory blocks 68.

Figure 20A:
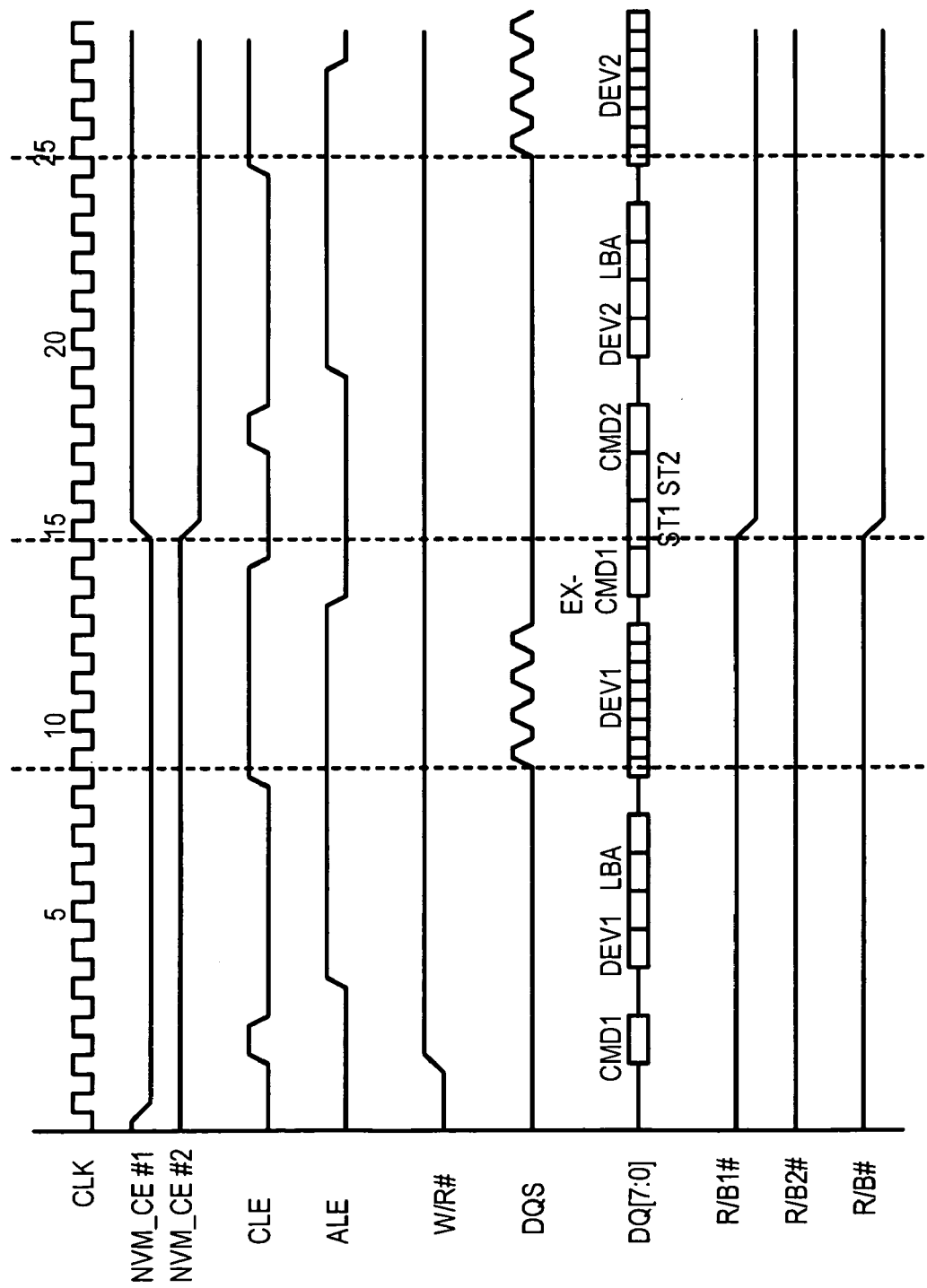
FIGS. 20A-B show timing waveforms of access by the smart storage switch to one interleave of channels of single-chip flash-memory devices.
Figure 20B:
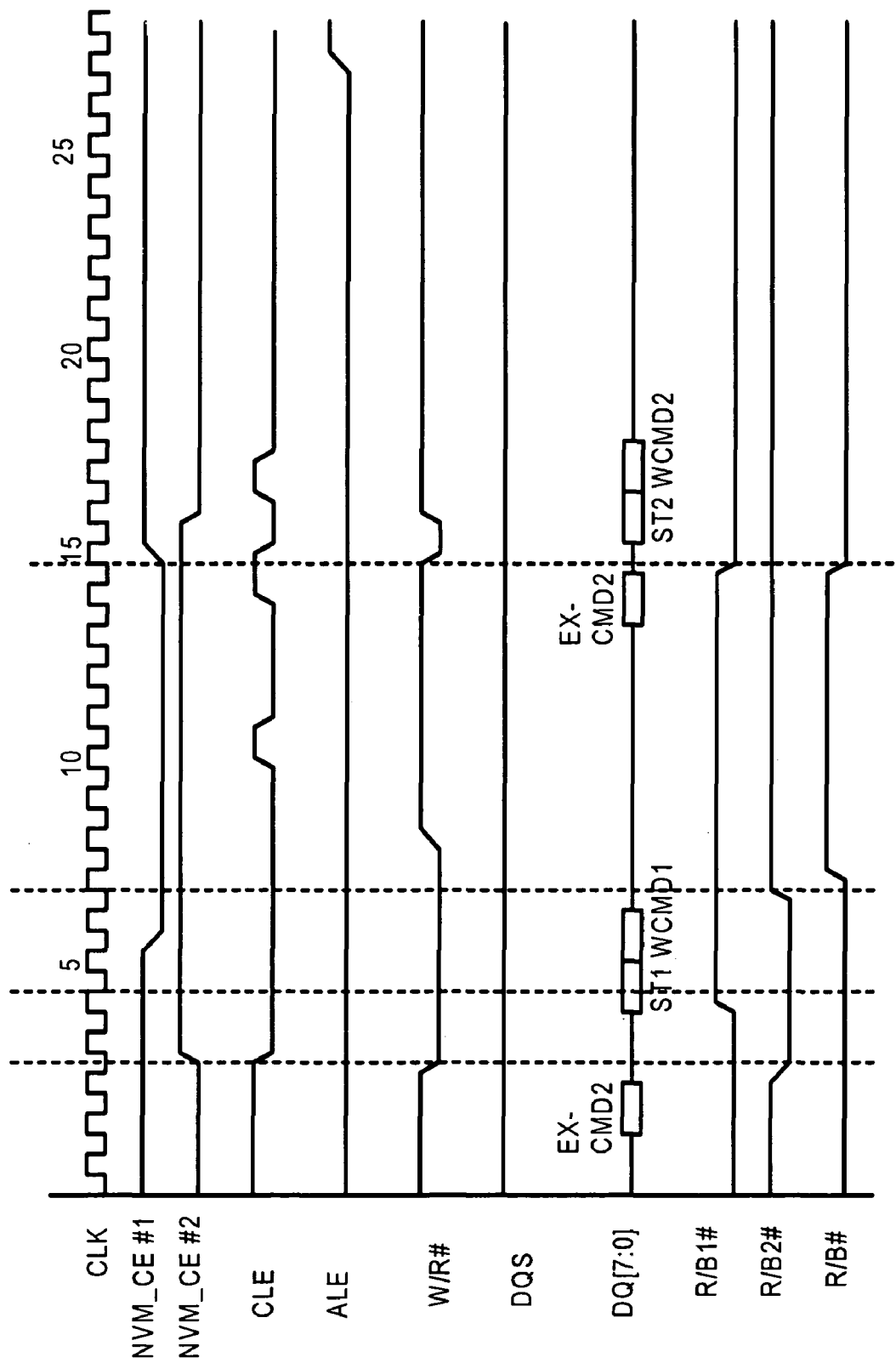

FIGS. 20A-B show timing waveforms of access by the smart storage switch to one interleave of channels of single-chip flash-memory devices. The flow of FIG. 18 and the architecture of FIG. 16 correspond to this timing.

Since two single-chip flash-memory devices 73 within one interleave share command and data buses, both single-chip flash-memory devices 73A, 73B in the first interleave may be accessed at separate times. In FIG. 20A, chip enable CE1 to the first single-chip flash-memory device 73A is asserted low to begin its access cycle, while chip enable CE2 remains high to prevent access by single-chip flash-memory device 73B. First command CMD1 is latched in using the shared command-latch-enable CLE and address DEV1 LBA is latched in using the shared address-latch-enable ALE signal.

Write data from the host and buffered by smart storage switch 30 (DEV1 on the shared DQ data bus) is latched into the single-chip flash-memory device using shared data strobe DQS. The finish command packet EX-CMD1 is sent at the end of access of first single-chip flash-memory device 73A, followed by status packet ST1.

Also in FIG. 20A, chip enable CE1 to the first single-chip flash-memory device 73A is de-asserted high in the middle of its cycle once data has been latched. Then the second chip enable CE2 to the second single-chip flash-memory device 73B is asserted low to begin its access cycle, while chip enable CE1 remains high to prevent use of the shared buses by single-chip flash-memory device 73A.

Second status packet ST2 is sent and second command CMD2 is latched in using the shared command-latch-enable CLE and address DEV2 LBA is latched in using the shared address-latch-enable ALE signal.

Write data from the host and buffered by smart storage switch 30 (DEV2 on the shared DQ data bus) is latched into the single-chip flash-memory device using shared data strobe DQS. In FIG. 20B the finish command packet EX-CMD2 is sent at the end of access of second single-chip flash-memory device 73BA, along with its status packet ST2. The second chip enable CE2 turns off while the first chip enable CE1 goes active again. Additional commands WCMD1, WCMD2 are sent separately in sequence to single-chip flash-memory devices 73A, 73B in the remainder of FIG. 20B. These commands do not transfer blocks of data.

Ready1 (R/B1#) is driven low to indicate that first single-chip flash-memory device 73A is busy, when its is internally writing to flash memory blocks 68. Ready2 (R/B2#) is driven low to indicate that second single-chip flash-memory device 73B is busy, when its is internally writing to its flash memory blocks 68. A combined ready signal R/B# is generated by AND'ing the two ready lines for devices 73A, 73B in the same interleave. This combined ready signal is sent to and monitored by smart storage switch 30.

For a special host sector write case, smart storage switch 30 performs a read process first to get the related page from the related single-chip flash-memory device into its volatile memory, and then updates the related sector in the page, then sends the updated page back to the related single-chip flash-memory device.

Figure 21:
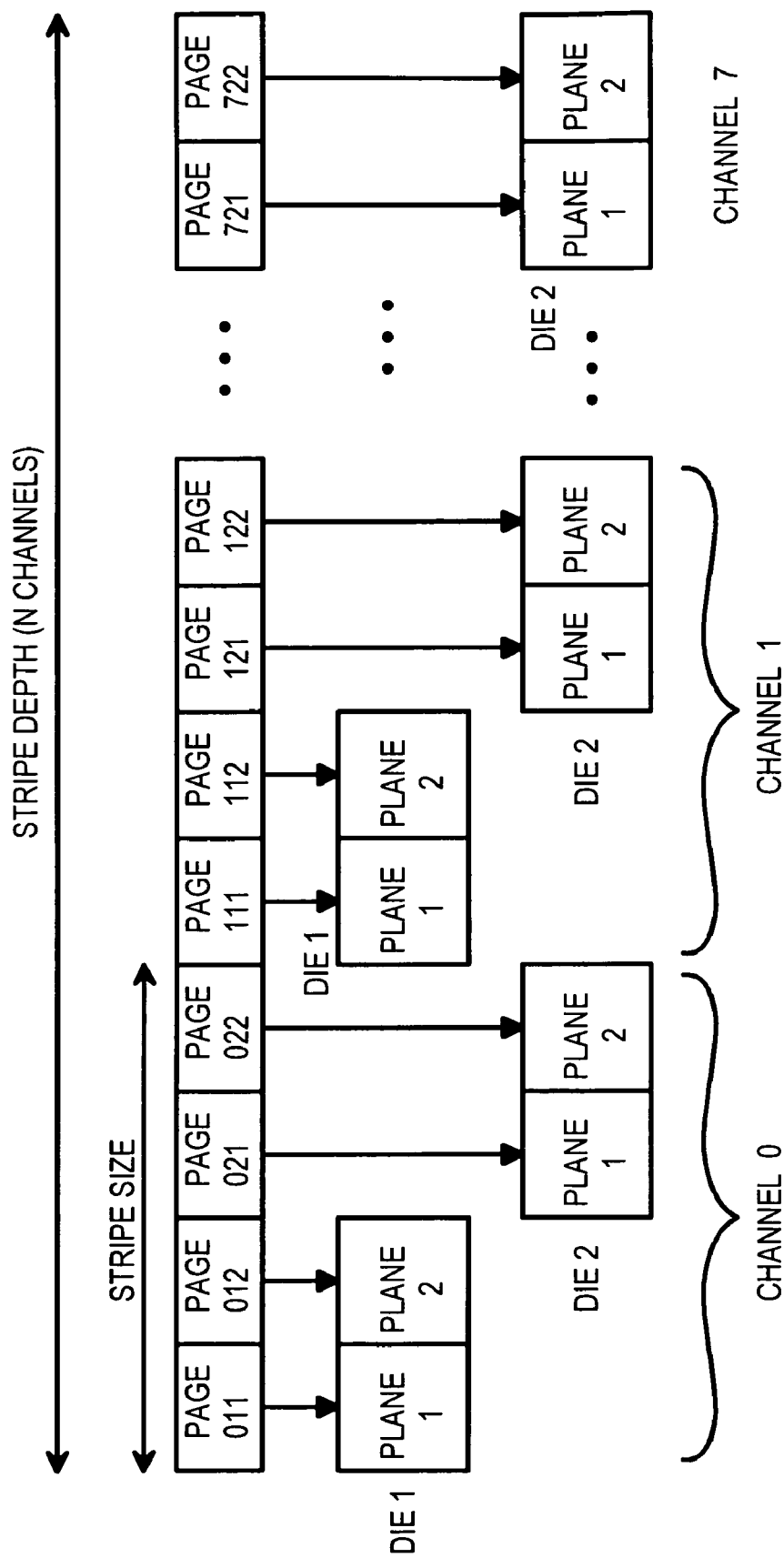
FIG. 21 highlights data striping that has a stripe size that is closely coupled to the single-chip flash-memory devices.

FIG. 21 highlights data striping that has a stripe size that is closely coupled to the single-chip flash-memory devices. Single-chip flash-memory devices 73 of FIG. 3 and other figures may have two flash-memory die per package, and each flash memory die has two planes. Having two die per package, and two planes per die increases flash access speed by utilizing two-plane commands of flash memory. The stripe size may be set to four pages when each plane can store one page of data. Thus one stripe is written to each channel, and each channel has one single-chip flash-memory devices 73 with two die that act as flash memory blocks 68.

The stripe depth is the number of channels times the stripe size, or N times 4 pages in this example. An 8-channel system with 8 single-chip flash-memory devices of two die per channel and two planes per die has 8 times 4 or 32 pages of data as the stripe depth that is set by smart storage switch 30. Data striping methods may change according to the LBA-NVMD physical flash memory architecture, when either the number of die or planes is increased, or the page size varies. Striping size may change with the flash memory page size to achieve maximum efficiency. The purpose of page-alignment is to avoid mis-match of local and central page size to increase access speed and improve wear leveling.

When the flash transaction layer function is performed, NVM controller 76 receives a Logical Sector Address (LSA) from smart storage switch 30 and translates the LSA to a physical address in the multi-plane flash memory.

Figure 22:
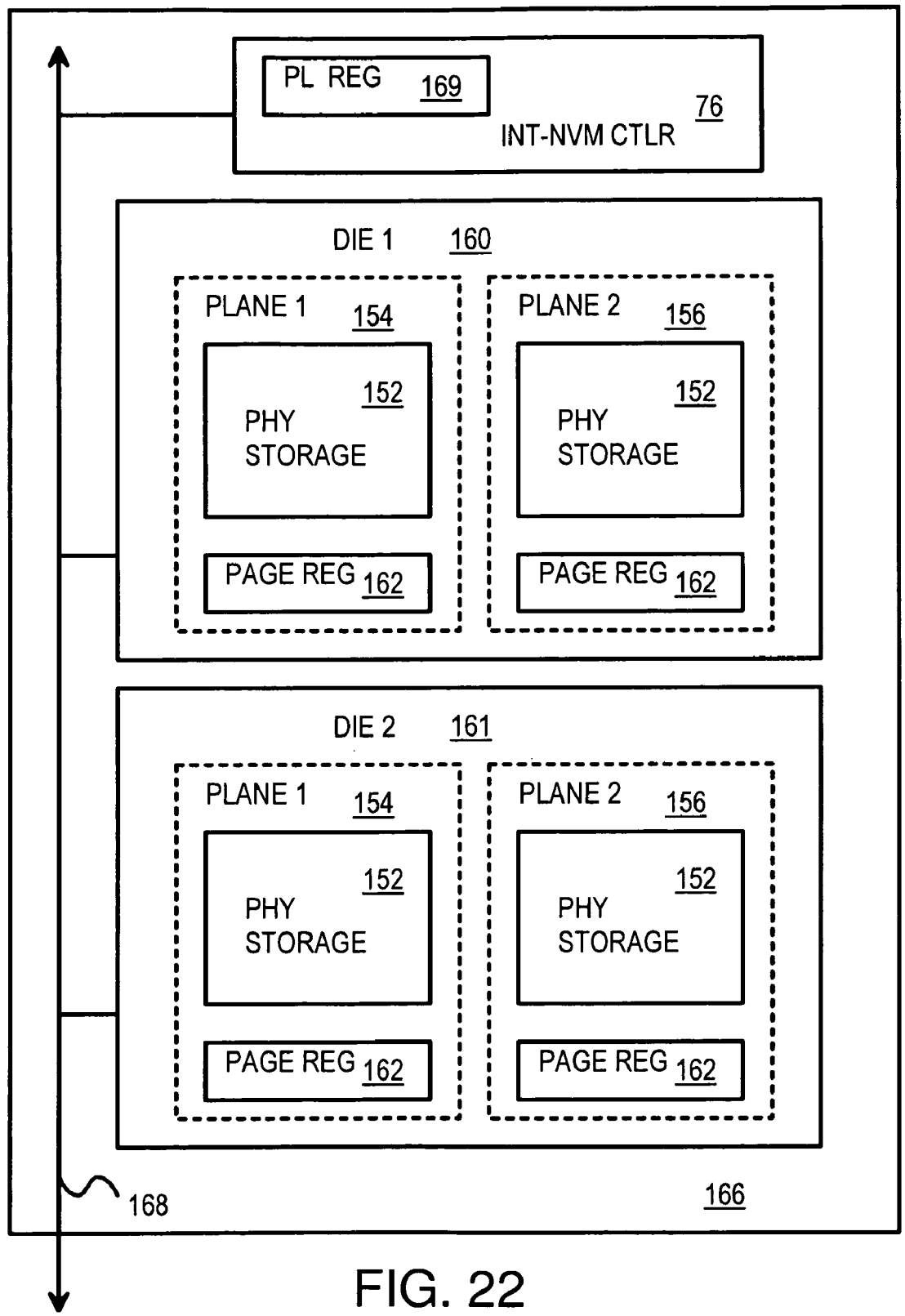
FIG. 22 shows two flash-memory die in a single-chip flash-memory device.

FIG. 22 shows two flash-memory die in a single-chip flash-memory device. Single-chip flash-memory device 166 includes NVM controller 76 and can replace single-chip flash-memory device 73 (FIG. 3). Bus 168 connects to both first die 160 and second die 161, which may be stacked on top of one another in a package for single-chip flash-memory device 166.

First die 160 has two arrays of physical storage 152 that are each written by pages registers 162. First plane 154 has one array of physical storage 152 and page register 162, while second plane 156 has another array of physical storage 152 and page register 162. Plane 154 and plane 156 may perform overlapping write operations once page registers 162 are written, so that two pages may be written to flash in first die 160.

Second die 161 has two arrays of physical storage 152 that are each written by pages registers 162. First plane 154 has one array of physical storage 152 and page register 162, while second plane 156 has another array of physical storage 152 and page register 162. Plane 154 and plane 156 may perform overlapping write operations once page registers 162 are written, so that two pages may be written to flash in Second die 161.

Thus four planes in single-chip flash-memory device 166 may write four pages to flash at a time. Pipeline register 169 in NVM controller 76 temporarily stores data during transfers. When smart storage switch 30 sends page-aligned data to the assigned single-chip flash-memory device 73, the data is stored in pipeline register 169 in NVM controller 76. Then NVM controller 76 alternately sends the data to the addressed flash memory page register in one of the two flash memory die. After this transfer is done, smart storage switch 30 can send more data.

Figure 23:
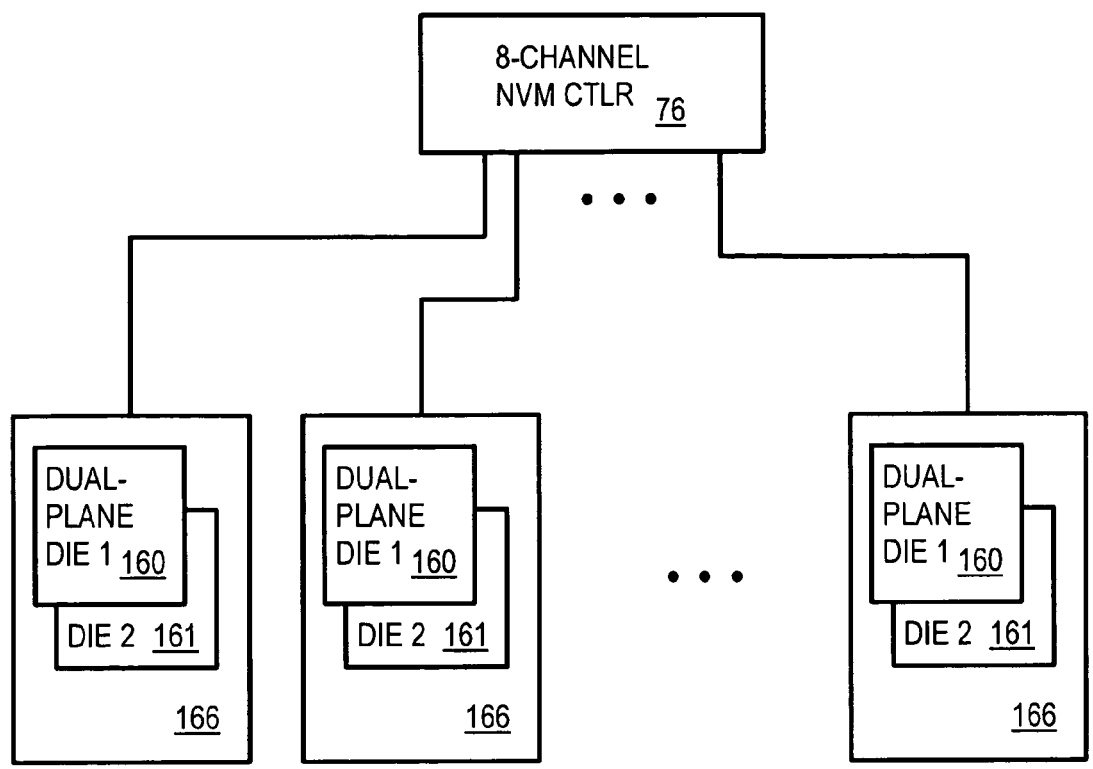
FIG. 23 shows multiple channels of dual-die and dual-plane single-chip flash-memory devices.

FIG. 23 shows multiple channels of dual-die and dual-plane single-chip flash-memory devices. Multi-channel NVM controller 76 can drive 8 channels of flash memory, and can be part of smart storage switch 30 (FIG. 3). Each channel has a single-chip flash-memory device 166 with first die 160 and second die 161, each with two planes per die. Thus each channel can write four pages at a time. Data is striped into stripes of 4 pages each to match the number of pages that may be written per channel.

Figure 24:
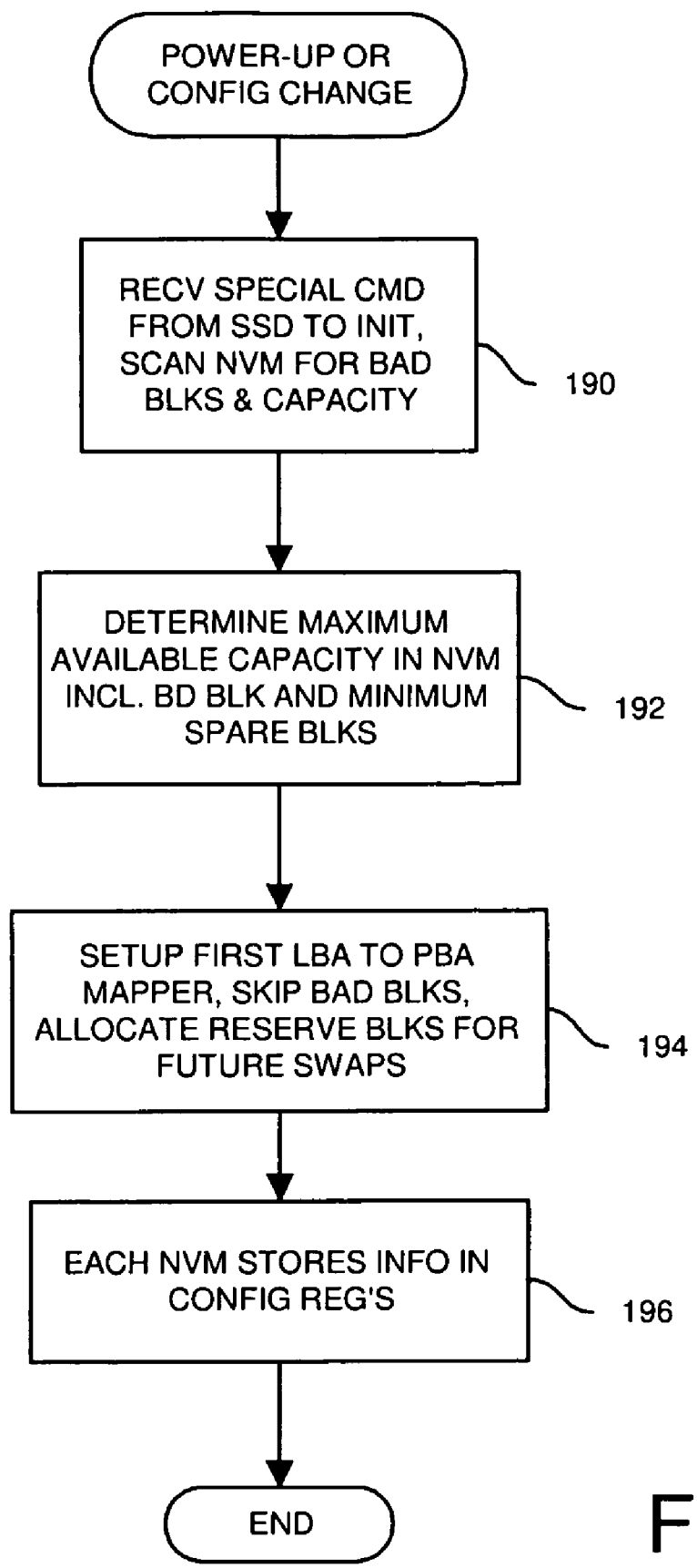
FIG. 24 is a flowchart of an initialization during manufacturing for each single-chip flash-memory device using data striping.

FIG. 24 is a flowchart of an initialization for each single-chip flash-memory device using data striping. When the single-chip flash-memory devices have multiple die with multiple planes per die for each channel, such as shown in FIGS. 21-23, each single-chip flash-memory devices performs this initialization routine when power is applied during manufacturing or the configuration is changed.

Each single-chip flash-memory device receives a special command from the smart storage switch, step 190, which causes the single-chip flash-memory device to scan for bad blocks and determine the physical capacity of flash memory controlled by the single-chip flash-memory device.

The maximum available capacity of all flash memory blocks in all die controlled by the single-chip flash-memory device is determined, step 192, and the minimum size of spare blocks and other system resources. The maximum capacity is reduced by any bad blocks found. These values are reserved for use by the manufacturing special command, and are programmable values, but they cannot be changed by users.

Mapping from LBA's to PBA's is set up in a mapper or mapping table, step 194, for this single-chip flash-memory device. Bad blocks are skipped over, and some empty blocks are reserved for later use to swap with bad blocks discovered in the future. The configuration information is stored in configuration registers in the single-chip flash-memory device, step 196, and is available for reading by the smart storage switch.

Figure 25:
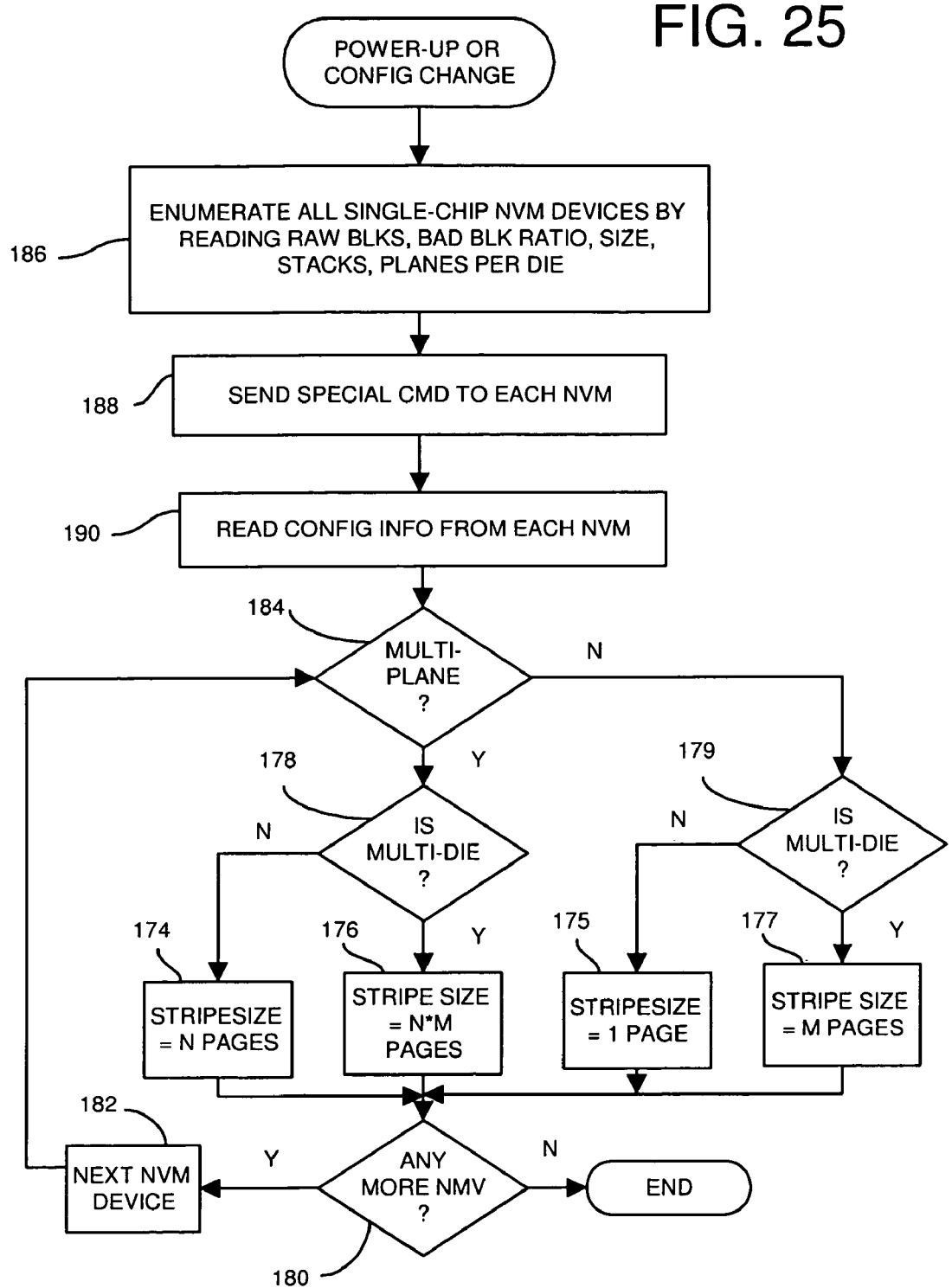
FIG. 25 is a flowchart of a power-on initialization of the smart storage switch using data striping.

FIG. 25 is a flowchart of an initialization of the smart storage switch when using data striping. When the single-chip flash-memory devices have multiple die with multiple planes per die for each channel, such as shown in FIGS. 21-23, the smart storage switch performs this initialization routine when power is applied during system manufacturing or when the configuration is changed.

The smart storage switch enumerates all single-chip flash-memory devices, step 186, by reading the raw flash blocks. The bad block ratio, size, stacking of die per device, and number of planes per die are obtained. The smart storage switch sends the special command to each single-chip flash-memory device, step 188, and reads configuration registers on each single-chip flash-memory device, step 190, such as set in step 196 of FIG. 24.

For each single-chip flash-memory device enumerated in step 186, when that device has multiple planes, step 184, and multiple die, step 178, the stripe size is set to N*M pages, step 176. When that device has multiple planes, step 184, but only one die, step 178, the stripe size is set to N pages, step 174.

When the current device has only one plane, step 184, and multiple die, step 179, the stripe size is set to M pages, step 177. When that device has only one plane, step 184, and only one die, step 179, the stripe size is set to 1 page, step 175.

When more single-chip flash-memory devices are left, step 180, the next single-chip flash-memory device is chosen for configuration, step 182, and the procedure loop repeats from step 184 for the next single-chip flash-memory device. The procedure ends when all single-chip flash-memory devices have been configured.

Figure 26:
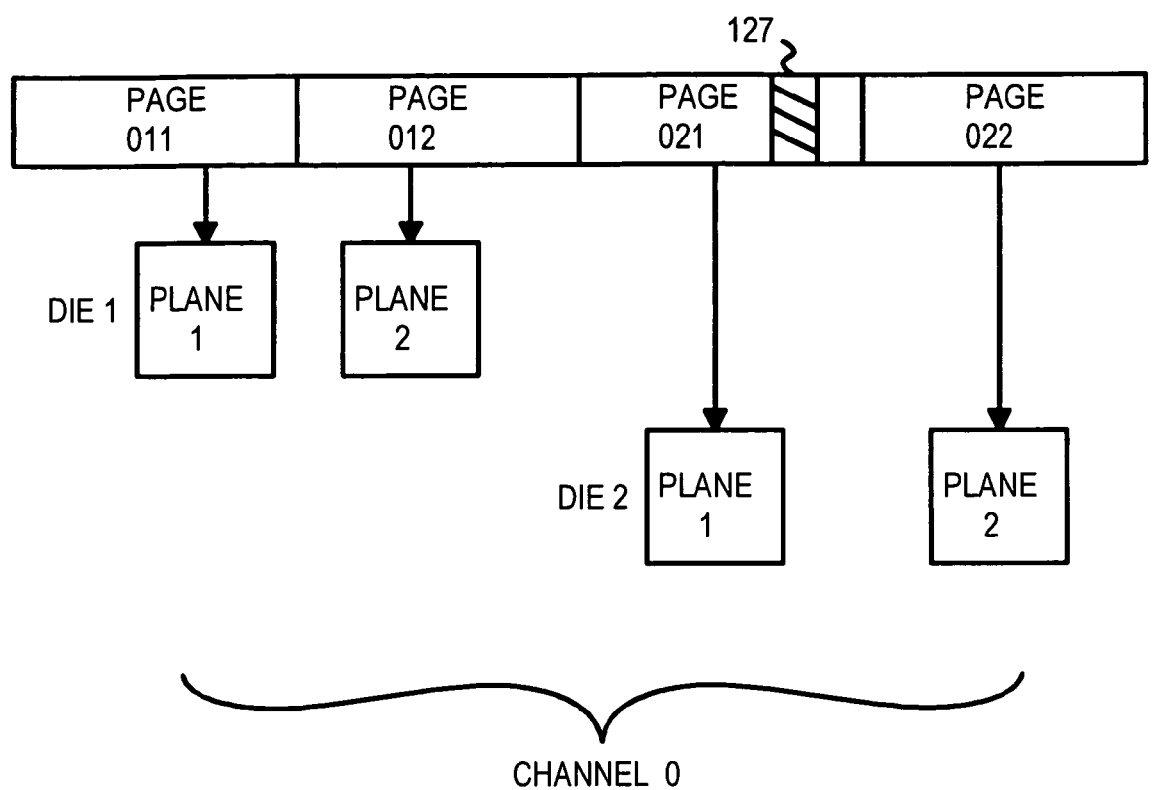
FIG. 26 highlights data striping when only one sector is updated in a page.

FIG. 26 highlights data striping when only one data sector is updated in a page. When only sector 127 in page 021 is being written, the old data stored in flash memory for page 021 is read. The old data is merged with the new data in sector 127 and the merged data is stored in pipeline register 169 (FIG. 22) and later written back to flash memory.

Global Wear-Leveling Method Used by Smart Storage Switch 30

For flash-based devices almost all media errors occur when either erasing or writing. Before a block can be written it must be erased, and as part of the erase procedure single-chip flash-memory devices 73 themselves check that all bits within the flash block being erased have reached to the erased state.

A Wear Leveling Monitor (WLM) is a storage volume installer utility program that allows for predictive failure analysis of system. WLM attempts to detect problems that worsen over time and that might eventually lead to a complete system failure. It may be implemented with a WLM-compliant SSD system, and either firmware included with the system's BIOS or software provided by a third-party utility.

The first stage of bad block management involves scanning all single-chip flash-memory devices 73 for blocks marked as defective by the manufacturer. This is done when the unit is powered up for the very first time and can take several minutes. This list of manufacturer's bad blocks is written as part of the Health Profile data and is used whenever the device is initialized/formatted.

The second stage is running the WLM utility software for status monitoring and defect and bad block management. Typically this WLM utility (for Reliability monitoring) will periodically monitor and keep track of erase/write/read/compare cycles on single-chip flash-memory devices 73 and report any errors encountered. It also has the ability to flag a particular single-chip flash-memory device 73 as being above the allowed threshold for potentially worn out blocks. Under these circumstances a particular single-chip flash-memory device 73 is replaced.

The following errors may be encountered during normal operations of the multi-LBA-NVMD flash device in FIG. 6. Several examples of the bad block replacement management scheme are given here:

(1) Errors Encountered while Erasing:

If a block fails to erase, the controller firmware of NVM controller 76 performs an erase retry sequence. If the failure still exists after a retry, that block is taken out of circulation and added to the defective blocks table (faulty block list). The block is never used again.

(2) Error Encountered while Writing (Also Called Programming Error):

If a write failure is detected, then all data pointing the block is relocated into a different empty block in single-chip flash-memory device 73. The failed blocks are taken out of circulation and are added to the defective blocks table.

(3) Correctable (via ECC) Error While Reading:

If the correction level required (the number of bits of ECC required to correct this error) is below the threshold level then no relocation action is taken. If it is above the threshold level, the data stored in single-chip flash-memory device 73 is moved to another block to avoid read disturbance. This particular flash block in single-chip flash-memory device 73 is recycled and used as a free block for further writes.

(4) Uncorrectable ECC Error While Reading:

This is an unrecoverable situation. The read error is reported back to smart storage switch 30, and the Central ECC scheme is used to correct this particular unrecoverable situation. The physical block address and device ID for single-chip flash-memory device 73 with the blocks that encountered the "Uncorrectable ECC error" is recorded in the "Health Profile" of each single-chip flash-memory device 73, which can be read by smart storage switch 30. The physical blocks are recycled as free blocks for further operation. However, if the "Uncorrectable ECC errors" occur again in the same physical blocks, then those blocks are taken out of circulation immediately.

(5) Bad Block Reporting to Smart Storage Switch 30:

Wear Leveling Monitor 526 (WLM) has intelligence built into the firmware that can be enabled by the host system to report such things as when the number of blocks mapped out on a given channel reaches a critical level or when the number of reads requiring ECC correction goes above a given percentage threshold within each single-chip LBA-NVMD. This feature is designed to warn of impending failure before any user data gets lost or the single-chip flash-memory device fails completely.

(6) Wear Leveling techniques used in the local single-chip LBA-NVMD::

At first, wear leveling was not implemented in flash memory cards or solid-state devices. A flash card that uses no wear leveling stops operating once the physical blocks wear out and all the spare blocks are used up for bad block replacement, regardless of how much storage space remains unused. Early flash cards used no wear leveling and thus failed in write-intensive applications.

(6.1) Dynamic wear leveling operates only over dynamic, or "free," areas. Systems using dynamic wear leveling do not touch static data. In a system using 75% of storage for static data, only 25% is available for wear leveling. Examples of static data may include a Master Boot Block (MBR), a File Descriptor Table, system programs, etc. Those are the data areas rarely getting modified. The other data areas containing information data are considered dynamic data areas.

The endurance of this dynamic wear leveling approach can be as much as 25 times greater than a card with no wear leveling, but only one-fourth that of an approach where wear-leveling is applied throughout the entire storage space.

(6.2) A static-wear-leveling algorithm evenly distributes data over an entire system and searches for the least-used physical blocks. Once it finds them, it writes the data to those locations. If blocks are empty, the write occurs normally. If they contain static data, it moves that data to a more heavily-used location before it moves the newly written data. The endurance of a storage system using static wear leveling can be 100 times better than an approach without wear leveling. A system with 75% of the storage containing static data is four times better than a card that implements dynamic wear leveling. Static wear leveling provides better endurance because it writes data to all blocks of the storage system. Static wear leveling also helps the static data get refreshed before read disturbance causes data loss of the static data. These numbers are for illustration purposes only and actual values may vary.

Alternate Embodiments

Several other embodiments are contemplated by the inventors. Using the president-governor arrangement of controllers, the controllers in smart storage switch 30 may be less complex than would be required for a single level of control for wear-leveling, bad-block management, re-mapping, caching, power management, etc. Since lower-level functions are performed among flash memory blocks 68 within each single-chip flash-memory device 73 as a governor function, the president function in smart storage switch 30 can be simplified. Less expensive hardware may be used in smart storage switch 30, such as using an 8051 processor for virtual storage processor 140 or smart storage transaction manager 36, rather than a more expensive processor core such as a an Advanced RISC Machine ARM-9 CPU core.

Different numbers and arrangements of flash storage blocks can connect to the smart storage switch. Rather than use LBA buses 28 or differential serial packet buses 27, other serial buses such as synchronous Double-Data-Rate (DDR), a differential serial packet data bus, a legacy flash interface, etc.

The mode logic could sense the state of a pin only at power-on rather than sense the state of a dedicated pin. A certain combination or sequence of states of pins could be used to initiate a mode change, or an internal register such as a configuration register could set the mode. A multi-bus-protocol chip could have an additional personality pin to select which serial-bus interface to use, or could have programmable registers that set the mode to hub or switch mode.

The transaction manager and its controllers and functions can be implemented in a variety of ways. Functions can be programmed and executed by a CPU or other processor, or can be implemented in dedicated hardware, firmware, or in some combination. Many partitionings of the functions can be substituted.

Overall system reliability is greatly improved by employing Parity/ECC with multiple single-chip flash-memory devices, and distributing data segments into a plurality of NVM blocks. However, it may require the usage of a CPU engine with a DDR/SDRAM cache in order to meet the computing power requirement of the complex ECC/Parity calculation and generation. Another benefit is that, even if one flash block or single-chip flash-memory device is damaged, data may be recoverable, or the smart storage switch can initiate a "Fault Recovery" or "Auto-Rebuild" process to insert a new single-chip flash-memory device, and to recover or to rebuild the "Lost" or "Damaged" data. The overall system fault tolerance is significantly improved.

Wider or narrower data buses and flash-memory chips could be substituted, such as with 16 or 32-bit data channels. Alternate bus architectures with nested or segmented buses could be used internal or external to the smart storage switch. Two or more internal buses can be used in the smart storage switch to increase throughput. More complex switch fabrics can be substituted for the internal or external bus.

Data striping can be done in a variety of ways, as can parity and error-correction code (ECC). Packet re-ordering can be adjusted depending on the data arrangement used to prevent re-ordering for overlapping memory locations. The smart switch can be integrated with other components or can be a stand-alone chip.

Additional pipeline or temporary buffers and FIFO's could be added. For example, a host FIFO in smart storage switch 30 may be may be part of smart storage transaction manager 36, or may be stored in SDRAM 60. Separate page buffers could be provided in each channel. The CLK_SRC shown in FIGS.

3, 4 is not necessary when NV MEM 68 in single-chip flash-memory devices 73 have an asynchronous interface.

A single package, a single chip, or a multi-chip package may contain one or more of the plurality of channels of flash memory and/or the smart storage switch.

A MLC-based single-chip flash-memory device 73 may have four MLC flash chips with two parallel data channels, but different combinations may be used to form other single-chip flash-memory devices 73, for example, four, eight or more data channels, or eight, sixteen or more MLC chips. The single-chip flash-memory device and channels may be in chains, branches, or arrays. For example, a branch of 4 single-chip flash-memory devices 73 could connect as a chain to smart storage switch 30. Other size aggregation or partition schemes may be used for different access of the memory. Flash memory, a phase-change memory, or ferroelectric random-access memory (FRAM), Magnetoresistive RAM (MRAM), Memristor, PRAM, SONOS, Resistive RAM (RRAM), Racetrack memory, and nano RAM (NRAM) may be used.

The host can be a PC motherboard or other PC platform, a mobile communication device, a personal digital assistant (PDA), a digital camera, a combination device, or other device. The host bus or host-device interface can be SATA, PCIE, SD, USB, or other host bus, while the internal bus to single-chip flash-memory device 73 can be PATA, multi-channel SSD using multiple SD/MMC, compact flash (CF), USB, or other interfaces in parallel. Single-chip flash-memory device 73 may be packaged in a TSOP, BGA, LGA, COB, PIP, SIP, CSP, POP, or Multi-Chip-Package (MCP) packages and may include flash memory blocks 68 or flash memory blocks 68 may be in separate flash chips. The internal bus may be fully or partially shared or may be separate buses. The SSD system may use a circuit board with other components such as LED indicators, capacitors, resistors, etc.

Directional terms such as upper, lower, up, down, top, bottom, etc. are relative and changeable as the system or data is rotated, flipped over, etc. These terms are useful for describing the device but are not intended to be absolutes.

Single-chip flash-memory device 73 may have a packaged controller and flash die in a single chip package that can be integrated either onto a PCBA, or directly onto the motherboard to further simplify the assembly, lower the manufacturing cost and reduce the overall thickness. Flash chips could also be used with other embodiments including the open frame cards.

Rather than use smart storage switch 30 only for flash-memory storage, additional features may be added. For example, a music player may include a controller for playing audio from MP3 data stored in the flash memory. An audio jack may be added to the device to allow a user to plug in headphones to listen to the music. A wireless transmitter such as a BlueTooth transmitter may be added to the device to connect to wireless headphones rather than using the audio jack. Infrared transmitters such as for IrDA may also be added. A BlueTooth transceiver to a wireless mouse, PDA, keyboard, printer, digital camera, MP3 player, or other wireless device may also be added. The BlueTooth transceiver could replace the connector as the primary connector. A Bluetooth adapter device could have a connector, a RF (Radio Frequency) transceiver, a baseband controller, an antenna, a flash memory (EEPROM), a voltage regulator, a crystal, a LED (Light Emitted Diode), resistors, capacitors and inductors. These components may be mounted on the PCB before being enclosed into a plastic or metallic enclosure.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another a tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A multi-level-control multi-flash device comprising:
  a smart storage switch which comprises:
    an upstream interface to a host for receiving host commands to access non-volatile memory (NVM) and for receiving host data and a host address;
    a smart storage transaction manager that manages transactions from the host;
    a virtual storage processor that maps the host address to an assigned single-chip flash-memory device to generate a logical block address (LBA), the virtual storage processor performing a first level of mapping wherein the virtual storage processor is able to map the host address to any single-chip flash-memory device as the assigned single-chip flash-memory device;
    a virtual storage bridge between the smart storage transaction manager and a LBA bus;
    a volatile memory buffer, coupled to the virtual storage processor, for temporarily storing the host data in a volatile memory that loses data when power is disconnected;
  a plurality of single-chip flash-memory devices that include the assigned single-chip flash-memory device, wherein a single-chip flash-memory device comprises:
    a NVM controller, coupled to the LBA bus to receive the LBA generated by the virtual storage processor and the host data from the virtual storage bridge;

a lower-level volatile memory buffer, in the NVM controller, for temporarily storing the host data in a local volatile memory that loses data when power is disconnected;

a second-level mapper, in the NVM controller, that maps the LBA to a physical block address (PBA); and non-volatile memory blocks, coupled to the NVM controller, for storing the host data at a block location identified by the PBA generated by the second-level mapper in the NVM controller;

whereby address mapping is performed at two levels to access the non-volatile memory blocks.

2. The multi-level-control multi-flash device of claim 1 wherein the smart storage switch further comprises:

a parity generator for generating error detecting code for the host data, the error correcting code being stored with the host data, whereby error detection code is added at a top level by the smart storage switch.

3. The multi-level-control multi-flash device of claim 1 further comprising:

a local clock source, within each of the plurality of single-chip flash-memory devices, for generating local clocks for clocking the NVM controllers and interfaces to the non-volatile memory blocks, wherein local clocks are generated within each of the plurality of single-chip flash-memory devices.

4. The multi-level-control multi-flash device of claim 1 wherein the non-volatile memory blocks in the plurality of single-chip flash-memory device are non-volatile memory that retain data when power is disconnected;

wherein the smart storage switch further comprises:

a virtual buffer bridge, coupled between the smart storage transaction manager and the volatile memory buffer.

5. The multi-level-control multi-flash device of claim 1 wherein the smart storage transaction manager further comprises:

a data striping unit that divides the host data into data segments that are assigned to different ones of the plurality of single-chip flash-memory devices, whereby the host data is striped at the top level.

6. The multi-level-control multi-flash device of claim 1 wherein the smart storage switch further comprises:

mode logic, coupled to the smart storage transaction manager, for determining when to set the smart storage transaction manager in a hub mode and when to set the smart storage transaction manager in a switch mode;

wherein the smart storage transaction manager responds to the host as a single-endpoint when the mode logic indicates the switch mode, wherein the smart storage transaction manager reports to the host a total aggregate memory capacity of all non-volatile memory blocks in all single-chip flash-memory devices in the plurality of single-chip flash-memory devices, wherein the smart storage switch causes the host to see the plurality of single-chip flash-memory devices as a single virtual flash-memory device when the mode logic indicates the switch mode.

7. The multi-level-control multi-flash device of claim 1 wherein the single-chip flash memory device comprises a flash module that is physically mounted to a host motherboard through a connector and socket, by direct solder attachment, or embedded within the host motherboard.

8. The multi-level-control multi-flash device of claim 1 wherein the smart storage transaction manager further comprises:

a reordering unit that re-orders a sequence of transactions from the host into an altered order of operations sent to the plurality of single-chip flash-memory devices through the virtual storage bridge, whereby host transactions are re-ordered at a top level.

9. A storage device comprising:

an upstream interface to a host that generates host data and host commands in a host sequence of commands;

a single-chip flash-memory device having a plurality of flash memory blocks for storing the host data in non-volatile solid-state memory that retains data when power is disconnected;

a virtual storage processor that assigns host commands to the single-chip flash-memory device, the virtual storage processor also storing attributes obtained from the single-chip flash-memory device, the attributes including memory capacities, wherein the virtual storage processor reports an aggregate sum of the memory capacities to the host;

a volatile memory buffer, coupled to the virtual storage processor, for temporarily storing the host data in a volatile memory that loses data when power is disconnected;

a lower-level controller in the single-chip flash-memory device, the lower-level controller comprising:

a remapping unit for converting logical addresses received from the upstream interface into physical addresses for accessing the plurality of flash memory blocks in the single-chip flash-memory device;

a wear-leveling unit for assigning new host data to a less-worn block in the plurality of flash memory blocks within the single-chip flash-memory device;

a lower-level volatile memory buffer for temporarily storing the host data in a local volatile memory that loses data when power is disconnected; and a bad block unit for tracking defective memory blocks within the single-chip flash-memory device, the bad block unit preventing the new host data from being stored in a defective memory block being tracked.

10. The storage device of claim 9 wherein the single-chip flash memory device comprises a flash module that is physically mounted to a host motherboard through a connector and socket, by direct solder attachment, or embedded within the host motherboard.

11. A smart-switched multiple non-volatile-memory system comprising:

an upstream interface to a host that generates host data and host commands in a host sequence of commands;

a smart storage transaction manager, coupled to the upstream interface, for re-ordering the host commands from the host sequence into a reordered sequence of operations;

a plurality of single-chip flash-memory devices each having a plurality of flash memory blocks for storing the host data in non-volatile solid-state memory that retains data when power is disconnected;

a virtual storage processor that assigns host commands to an assigned device in the plurality of single-chip flash-memory devices, the virtual storage processor also storing attributes obtained from each of the plurality of single-chip flash-memory devices, the attributes including memory capacities, wherein the virtual storage processor reports an aggregate sum of the memory capacities to the host;

a volatile memory buffer, coupled to the virtual storage processor, for temporarily storing the host data in a volatile memory that loses data when power is disconnected;

a virtual storage bridge, coupled between the smart storage transaction manager and the plurality of single-chip flash-memory devices;

a lower-level controller in each of the plurality of single-chip flash-memory devices, the lower-level controller in a single-chip flash-memory device comprising:
  a remapping unit for converting logical addresses received from the virtual storage bridge into physical addresses for accessing the plurality of flash memory blocks in the single-chip flash-memory device;
  a wear-leveling unit for assigning new host data to a less-worn block in the plurality of flash memory blocks within the single-chip flash-memory device;
  a lower-level volatile memory buffer for temporarily storing the host data in a local volatile memory that loses data when power is disconnected; and
  a bad block unit for tracking defective memory blocks within the single-chip flash-memory device, the bad block unit preventing the new host data from being stored in a defective memory block being tracked;

whereby the virtual storage processor aggregates memory capacities of the plurality of single-chip flash-memory devices which each re-map and wear-level flash memory blocks within a single-chip flash-memory device.

12. The smart-switched multiple non-volatile-memory system of claim 11 wherein the smart storage transaction manager further comprises:

a wear monitor for monitoring wear levels reported by the plurality of single-chip flash-memory devices;

a storage volume installer, activated by the wear monitor when a single-chip flash-memory device reports a high wear level above a threshold, for replacing the single-chip flash-memory device with high wear level with a replacement single-chip flash-memory device, whereby wear leveling is performed at a lower level by each of the plurality of single-chip flash-memory devices and storage volume replacement is performed by the smart storage transaction manager.

13. The smart-switched multiple non-volatile-memory system of claim 11 wherein the smart storage transaction manager further comprises:

a data striping unit for segmenting host data into data segments stored on several of the plurality of single-chip flash-memory devices;

wherein each single-chip flash-memory device further comprises an error-correction code (ECC) unit for appending ECC to the host data sent to the assigned device in the plurality of single-chip flash-memory device for storage in the plurality of flash memory blocks, whereby high-level data striping is performed before the host data is sent to the plurality of single-chip flash-memory devices.

14. The smart-switched multiple non-volatile-memory system of claim 13 further comprising:

a dynamic-random-access memory (DRAM) buffer for temporarily storing the host data;

a virtual buffer bridge between the DRAM buffer and the smart storage transaction manager, whereby host data is buffered by the DRAM buffer.

15. The smart-switched multiple non-volatile-memory system of claim 11 wherein the smart storage transaction manager further comprises:

an interleave unit, coupled to the virtual storage bridge, for interleaving host data to a plurality of interleaves of the plurality of single-chip flash-memory devices, whereby the plurality of single-chip flash-memory devices are accessed in interleaves.

16. The smart-switched multiple non-volatile-memory system of claim 13 wherein the single-chip flash-memory devices comprises a flash module that is physically mounted to a host motherboard through a connector and socket, by direct solder attachment, or embedded within the host motherboard.

17. A data-striped solid-state-disk comprising:

volatile memory buffer means for temporarily storing host data in a volatile memory that loses data when power is disconnected;

smart storage switch means for switching host commands to a plurality of downstream devices, the smart storage switch means comprising:
  upstream interface means, coupled to a host, for receiving host commands to access flash memory and for receiving host data and a host address;
  smart storage transaction manager means for managing transactions from the host;
  virtual storage processor means for translating the host address to an assigned single-chip flash-memory device to generate a logical block address (LBA), the virtual storage processor means performing a first level of mapping, wherein the host address is mappable to any single-chip flash-memory device when the host address contains host data that has not yet been mapped by the virtual storage processor means;
  virtual storage bridge means for transferring host data and the LBA between the smart storage transaction manager means and a LBA bus;
  virtual buffer bridge means, coupled between the smart storage transaction manager means and the volatile memory buffer means;
  volatile memory buffer means, coupled to the virtual storage processor means, for temporarily storing the host data in a volatile memory that loses data when power is disconnected;
  reordering means for re-ordering a sequence of transactions from the host into an altered order of operations sent through the virtual storage bridge means;
  data striping means for dividing the host data into data segments that are assigned to different ones of the plurality of single-chip flash-memory devices;

a plurality of single-chip flash-memory devices that include the assigned single-chip flash-memory device, wherein a single-chip flash-memory device comprises:
  lower-level controller means for controlling flash operations, coupled to the LBA bus to receive the LBA generated by the virtual storage processor means and the host data from the virtual storage bridge means;
  a lower-level volatile memory buffer for temporarily storing the host data in a local volatile memory that loses data when power is disconnected;
  second-level map means, in the lower-level controller means, for mapping the LBA to a physical block address (PBA) and
  non-volatile memory blocks, coupled to the lower-level controller means, for storing the host data at a block location identified by the PBA generated by the second-level map means in the lower-level controller means;

wherein the non-volatile memory blocks in the plurality of single-chip flash-memory device are non-volatile memory that retain data when power is disconnected, whereby address mapping is performed at two levels to access the non-volatile memory blocks.

18. The data-striped solid-state-disk of claim 17 wherein the lower-level controller means further comprises:
wear-leveler means for assigning host data to a less-worn block in the non-volatile memory blocks, the less-worn block having a lower wear count value than other blocks, wherein the wear-leveler means examines wear count values to assign host data to blocks;
bad block manager means, having a list of faulty blocks in the non-volatile memory blocks, for causing the wear-leveler means to avoid assigning host data to a block in the list of faulty blocks,
whereby wear-leveling and bad block management are performed at a lower level within each of the plurality of single-chip flash-memory devices.

19. The data-striped solid-state-disk of claim 18 wherein the non-volatile memory blocks comprise two flash die that are stacked together and accessible by interleaving, and wherein each of the two flash die comprises two planes that are accessible by interleaving;
wherein a size of the data segment is equal to four pages per channel, and each channel has one of the plurality of single-chip flash-memory devices, whereby the host data is striped with a depth to match the plurality of single-chip flash-memory devices.

20. The data-striped solid-state-disk of claim 17 wherein a stripe depth is equal to N times a stripe size, wherein N is a whole number of the plurality of single-chip flash-memory devices, and wherein the stripe size is equal to a number of pages that can be simultaneously written into one of the plurality of single-chip flash-memory devices.

21. The data-striped solid-state-disk of claim 17 wherein the single-chip flash-memory device comprises a flash module that is physically mounted to a host motherboard through a connector and socket, by direct solder attachment, or embedded within the host motherboard.

* * * * *